United States Patent
Frisch et al.

(10) Patent No.: US 11,501,196 B2
(45) Date of Patent: Nov. 15, 2022

(54) QUBIT TUNING BY MAGNETIC FIELDS IN SUPERCONDUCTORS

(71) Applicant: International Business Machines Corporation, Armonk, NY (US)

(72) Inventors: Albert Frisch, Stuggart (DE); Harry Barowski, Schoenaich (DE); Markus Brink, White Plains, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 1025 days.

(21) Appl. No.: 16/200,062

(22) Filed: Nov. 26, 2018

(65) Prior Publication Data

US 2020/0167683 A1    May 28, 2020

(51) Int. Cl.
| | | |
|---|---|---|
| *G06F 15/78* | (2006.01) | |
| *G06N 10/00* | (2022.01) | |
| *H01F 6/06* | (2006.01) | |
| *H01L 39/02* | (2006.01) | |
| *H05B 3/00* | (2006.01) | |
| *H05K 7/20* | (2006.01) | |

(52) U.S. Cl.
CPC ......... *G06N 10/00* (2019.01); *G06F 15/7807* (2013.01); *H01F 6/06* (2013.01); *H01L 39/025* (2013.01); *H05B 3/0033* (2013.01); *H05K 7/20372* (2013.01)

(58) Field of Classification Search
CPC ....... G06N 10/00; G06F 15/7807; H01F 6/06; H01L 39/025; H05B 3/0033; H05K 7/20372
See application file for complete search history.

(56) References Cited

U.S. PATENT DOCUMENTS

| | | | | |
|---|---|---|---|---|
| 4,074,343 A | * | 2/1978 | Chaussy | G01R 19/18 505/868 |
| 5,521,862 A | * | 5/1996 | Frazier | G11C 11/44 257/38 |
| 6,911,664 B2 | * | 6/2005 | Il'ichev | G06N 10/00 977/933 |

(Continued)

FOREIGN PATENT DOCUMENTS

| | | |
|---|---|---|
| EP | 2863342 A3 | 3/2016 |
| WO | 2018035448 A1 | 2/2018 |

OTHER PUBLICATIONS

Longobardi, "Studied of Quantum Transitions of Magnetic Flux in a rf SQUID Qubit", Stony Brook University, 2009, https://ir.stonybrook.edu/xmlui/bitstream/handle/11401/71121/000000730.sbu.pdf?sequence=I.

(Continued)

*Primary Examiner* — Cheng Yuan Tseng
(74) *Attorney, Agent, or Firm* — Garg Law Firm, PLLC; Rakesh Garg; Erik Johnson

(57) ABSTRACT

An embodiment of a qubit tuning device includes a first layer configured to generate a magnetic field, the first layer comprising a material exhibiting superconductivity in a cryogenic temperature range. In an embodiment, the qubit tuning device includes a qubit of a quantum processor chip, wherein the first layer is configured to magnetically interact with the qubit such that a first magnetic flux of the first layer causes a first change in a first resonance frequency of the qubit by a first frequency shift value.

20 Claims, 25 Drawing Sheets

(56) References Cited

U.S. PATENT DOCUMENTS

| | | | |
|---|---|---|---|
| 6,960,780 B2 | 11/2005 | Blais et al. | |
| 7,042,005 B2 | 5/2006 | Il'ichev et al. | |
| 7,807,278 B2 * | 10/2010 | Sugimoto | G11B 5/737 |
| | | | 428/827 |
| 7,888,290 B2 * | 2/2011 | Gulian | H01L 39/249 |
| | | | 505/412 |
| 8,812,066 B2 * | 8/2014 | Lanting | G01R 33/0354 |
| | | | 327/528 |
| 9,400,127 B2 * | 7/2016 | Gervais | H01L 23/34 |
| 9,476,950 B2 * | 10/2016 | Faley | H01C 1/14 |
| 9,841,484 B2 | 12/2017 | Mohebbi et al. | |
| 9,865,648 B2 * | 1/2018 | Bunyk | H01L 24/13 |
| 10,031,887 B2 * | 7/2018 | Raymond | G06N 10/00 |
| 10,283,694 B2 * | 5/2019 | Yohannes | H01L 39/2493 |
| 10,475,983 B1 * | 11/2019 | Rosenblatt | G06N 10/00 |
| 10,510,943 B1 * | 12/2019 | Topaloglu | G05B 15/02 |
| 10,615,223 B2 * | 4/2020 | Rosenblatt | B82Y 10/00 |
| 10,671,559 B2 * | 6/2020 | Mohseni | G06F 15/80 |
| 11,050,009 B2 * | 6/2021 | Topaloglu | H01L 39/2493 |
| 11,121,301 B1 * | 9/2021 | Marshall | H01L 27/18 |
| 11,276,727 B1 * | 3/2022 | Renzas | H01L 23/5383 |
| 2009/0322374 A1 | 12/2009 | Przybysz et al. | |
| 2010/0026447 A1 | 2/2010 | Keefe et al. | |
| 2015/0084635 A1 * | 3/2015 | Kawaguchi | G01R 33/3804 |
| | | | 324/322 |
| 2018/0113373 A1 | 4/2018 | Witmer et al. | |
| 2018/0138987 A1 * | 5/2018 | Sliwa | H01L 27/18 |
| 2019/0131511 A1 * | 5/2019 | Clarke | B82Y 10/00 |
| 2019/0164077 A1 * | 5/2019 | Roberts | H01L 39/025 |
| 2020/0299146 A1 * | 9/2020 | Zhao | H01F 6/00 |

OTHER PUBLICATIONS

International Searching Authority, PCT/EP2019/081933, dated Feb. 28, 2020.

Kim et al., "Thin-film superconducting resonator tunable to the ground-state hyperfine splitting of 87Rb", American Institute of Physics, 2011. https://aip.scitation.org/doi/pdf/10.1063/1.3651466.

List of IBM Related applications, Appendix P, 2018.

Golubovic et al., "Magnetic phase shifter for superconducting qubit", arxiv.org, Cornell University Library, 201 Olin Library Cornell University Ithaca, pp. 2-4, Mar. 12, 2004.

Palacios-Laloy et al., "Tunable resonators for quantum circuits", arxiv.org, Cornell University Library 281, Olin Library Cornell University Ithaca, pp. 1-8, Dec. 3, 2007.

International Searching Authority, PCT/EP2019/081938, dated Feb. 13, 2020.

* cited by examiner

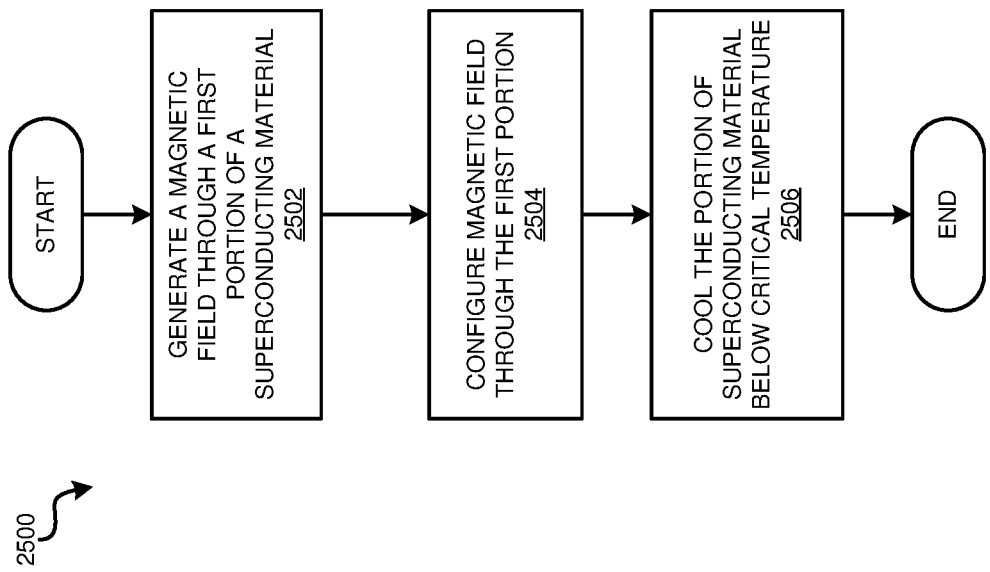

QUBIT TUNING BY MAGNETIC FIELDS IN SUPERCONDUCTORS

TECHNICAL FIELD

The present invention relates generally to a device, a fabrication method, and fabrication system for adjusting the resonance frequencies of quantum bits in quantum processors. More particularly, the present invention relates to a device, method, and system for qubit tuning by magnetic fields in superconductors.

BACKGROUND

Hereinafter, a "Q" prefix in a word or phrase is indicative of a reference of that word or phrase in a quantum computing context unless expressly distinguished where used.

Molecules and subatomic particles follow the laws of quantum mechanics, a branch of physics that explores how the physical world works at a fundamental level. At this level, particles behave in strange ways, taking on more than one state at the same time, and interacting with other particles that are very far away. Quantum computing harnesses these quantum phenomena to process information.

The computers we use today are known as classical computers (also referred to herein as "conventional" computers or conventional nodes, or "CN"). A conventional computer uses a conventional processor fabricated using semiconductor materials and technology, a semiconductor memory, and a magnetic or solid-state storage device, in what is known as a Von Neumann architecture. Particularly, the processors in conventional computers are binary processors, i.e., operating on binary data represented in 1 and 0.

A quantum processor (Q-processor) uses the odd nature of quantum bit devices (compactly referred to herein as "qubit," plural "qubits") to perform computational tasks. In the particular realms where quantum mechanics operates, particles of matter can exist in multiple states-such as an "on" state, an "off" state, and both "on" and "off" states simultaneously. Where classical computing using semiconductor processors is limited to using just the on and off states (equivalent to 1 and 0 in binary code), a Q-processor harnesses these quantum states of matter to output signals that are usable in data computing.

Conventional computers encode information in bits. Each bit can take the value of 1 or 0. These is and 0s act as on/off switches that ultimately drive computer functions. Quantum computers, on the other hand, are based on qubits, which differ from classical computers according to two key principles of quantum physics: superposition and entanglement. Superposition means that each qubit can represent both a 1 and a 0 at the same time. Entanglement means that qubits in a superposition can be correlated with each other in a non-classical way; that is, the state of one (whether it is a 1 or a 0 or both) can depend on the state of another, and that there is more information that can be ascertained about the two qubits when they are entangled than when they are treated individually.

Using these two principles, qubits operate as more sophisticated processors of information, enabling quantum computers to function in ways that allow them to solve difficult problems that are intractable using conventional computers. IBM has successfully constructed and demonstrated the operability of a Q-processor using superconducting qubits (IBM is a registered trademark of International Business Machines Corporation in the United States and in other countries.)

A superconducting qubit includes a Josephson junction. A Josephson junction is formed by separating two thin-film superconducting metal layers by a non-superconducting material. When the metal in the superconducting layers is caused to become superconducting—e.g. by reducing the temperature of the metal to a specified cryogenic temperature—pairs of electrons can tunnel from one superconducting layer through the non-superconducting layer to the other superconducting layer. In a qubit, the Josephson junction—which functions as a dispersive nonlinear inductor—is electrically coupled in parallel with one or more capacitive devices forming a nonlinear microwave oscillator. The oscillator has a resonance/transition frequency determined by the value of the inductance and the capacitance in the qubit. Any reference to the term "qubit" is a reference to a superconducting qubit oscillator circuitry that employs a Josephson junction unless expressly distinguished where used.

In a superconducting state, the material firstly offers no resistance to the passage of electrical current. When resistance falls to zero, a current can circulate inside the material without any dissipation of energy. Secondly, the material exhibits Meissner effect, i.e., provided they are sufficiently weak, external magnetic fields do not penetrate the superconductor, but remain at its surface. When one or both of these properties are no longer exhibited by the material, the material is said to be no longer superconducting.

A critical temperature of a superconducting material is a temperature at which the material begins to exhibit characteristics of superconductivity. Superconducting materials exhibit very low or zero resistivity to the flow of current. A critical field is the highest magnetic field, for a given temperature, under which a material remains superconducting.

Superconductors are generally classified into one of two types. Type I superconductors exhibit a single transition at the critical field. Type I superconductors transition from a non-superconducting state to a superconducting state when the critical field is reached. Type II superconductors include two critical fields and two transitions. At or below the lower critical field, type II superconductors exhibit a superconducting state. Above the upper critical field, type II superconductors exhibit no properties of superconductivity. Between the upper critical field and the lower critical field, type II superconductors exhibit a mixed state. In a mixed state, type II superconductors exhibit an incomplete Meissner effect, i.e., penetration of external magnetic fields in quantized packets at specific locations through the superconductor material.

The Meissner effect results from the generation of persistent currents at the surface of the superconductor material. Persistent currents are perpetual electric currents which do not require an external power source. The persistent currents generate an opposing magnetic field to cancel the external magnetic field throughout the bulk of the superconductor material. In a superconducting state, persistent currents do not decay with time due to the zero resistance property.

A superconductor material above the critical temperature allows penetration of an external magnetic field. Cooling the superconductor material at or below the critical temperature while maintaining the external magnetic field results in the generation of persistent currents. The persistent currents flow indefinitely due to the superconductor material offering no resistance to the passage of electrical current. The external magnetic field can be switched off or removed altogether and the persistent currents remain. The persistent currents generate a magnetic field outside the superconductor material. The magnetic field generated by the persistent currents compensates for the change in magnetic flux from the switched off external magnetic field. The superconducting material acts as a permanent magnet as long as the temperature does not rise above the critical temperature.

The information processed by qubits is carried or transmitted in the form of microwave signals/photons in the range of microwave frequencies. The microwave frequency of a qubit output is determined by the resonance frequency of the qubit. The microwave signals are captured, processed, and analyzed to decipher the quantum information encoded therein. A readout circuit is a circuit coupled with the qubit to capture, read, and measure the quantum state of the qubit. An output of the readout circuit is information usable by a Q-processor to perform computations.

A superconducting qubit has two quantum states—|0> and |1>. These two states may be two energy states of atoms, for example, the ground (|0>) and first excited state (|1>) of a superconducting artificial atom (superconducting qubit). Other examples include spin-up and spin-down of the nuclear or electronic spins, two positions of a crystalline defect, and two states of a quantum dot. Since the system is of a quantum nature, any combination of the two states is allowed and valid.

For quantum computing using qubits to be reliable, quantum circuits, e.g., the qubits themselves, the readout circuitry associated with the qubits, and other parts of the Q-processor, must not alter the energy states of the qubit, such as by injecting or dissipating energy, in any significant manner or influence the relative phase between the |0> and |1> states of the qubit. This operational constraint on any circuit that operates with quantum information necessitates special considerations in fabricating semiconductor and superconducting structures that are used in such circuits.

The illustrative embodiments recognize that a qubit's resonance frequency is inherently fixed at the time the qubit is fabricated, i.e., when the Josephson junction and the capacitive element of the qubit-oscillator are fabricated on a Q-processor chip. The illustrative embodiments further recognize that in the simplest implementation of a Q-processor, at least two qubits are needed to implement a quantum logic gate. Therefore, a Q-processor chip is typically fabricated to have at least 2, but often 8, 16, or more qubits on a single Q-processor chip.

Some qubits are fixed-frequency qubits, i.e., their resonance frequencies are not changeable. Other qubits are frequency-tunable qubits. A Q-processor can employ fixed-frequency qubits, frequency-tunable qubits, or a combination thereof.

The illustrative embodiments recognize that it is difficult to fabricate single-junction transmons or fixed-frequency superconducting qubits with specific accurate frequencies or accurate frequency differences between neighboring qubits. This is mainly because the critical current of Josephson junctions is not a well-controlled parameter in the fabrication process. This results in a relatively wide-spread in the critical currents of Josephson junctions having the same design and area and fabricated on the same chip.

The illustrative embodiments recognize that when the resonance frequencies of two neighboring coupled qubits on a chip are the same or within a threshold band of frequencies or their higher transition frequencies are on resonance or close to resonance, then negative effects can happen such as, crosstalk, quantum decoherence, energy decay, creation of mixed states, unintended information transfer, quantum state leakage and so on. Having such qubits can also negatively affect the performance or utility of certain quantum gates such as cross-resonance gates which have stringent requirements on the spectrum of resonance frequencies of qubits upon which the gate is operating on. Therefore, the illustrative embodiments recognize that one challenge in Q-processors that are based on coupled fixed-frequency qubits is frequency crowding or frequency collision between adjacent qubits, in particular, when cross-resonance gates are used.

It is important to note that while the proposed qubit tuning technique is motivated by the need to solve frequency collisions of coupled qubits on the same chip which are acted on with cross-resonance gates, the proposed qubit tuning technique is general, and can be applied to other kinds of quantum devices on chip which require qubit tuning without penetrating the device package.

The illustrative embodiments recognize that a frequency-tunable qubit (hereinafter compactly referred to as a "tunable qubit") has a flux-dependent inductance. Frequency tunability can be achieved, for example, by replacing the single Josephson junction of a fixed frequency qubit with a superconducting loop that includes one or more Josephson junctions. By varying the magnetic field threading the loop, the inductance of the loop changes, which in turn changes the resonance frequency of the qubit, thus making the qubit tunable. The illustrative embodiments recognize that one challenge in Q-processors that are based on tunable-frequency qubits is sensitivity to flux noise which leads to dephasing.

Presently, when the frequency of a flux-tunable qubit on a chip has to be changed, there are two main methods that are used in the state-of-the-art to apply or change the flux threading the loop of the qubit. The first method is using a global superconducting coil attached to the qubit-chip package. This method has the advantage of having an external fully controllable magnetic source which does not penetrate the device package. Such an external source can be filtered well and avoids several negative effects. The disadvantage of this method is that the qubits cannot be individually controlled and tuned.

The second method is using on-chip magnetic field lines or flux-lines that are placed on the Q-processor chip and routed near the qubit. The advantages of this method are: 1—it is scalable, 2—enables high-density flux-line systems for large Q-processors, 3—allows individual qubits to be tuned and controlled. The disadvantages of this method are: 1—it introduces additional noise channels between the Q-processor and the external environment which can negatively affect the coherence and performance of the Q-processors, 2—it is difficult to fabricate and route the on-chip flux-lines near the qubits inside the device package.

SUMMARY

The illustrative embodiments provide a superconducting device, a method and system of fabrication therefore. A superconducting qubit tuning device of an embodiment includes a first layer configured to generate a magnetic field, the first layer comprising a material exhibiting superconductivity in a cryogenic temperature range. In an embodiment, the device includes a qubit of a Q-processor chip, wherein the first layer is configured to magnetically interact with the qubit such that a first magnetic flux of the first layer causes a first change in a first resonance frequency of the qubit by a first frequency shift value.

In an embodiment, the device includes a heating element configured to heat a portion of the first layer above a critical temperature. In an embodiment, the device includes a magnetic element configured to apply a magnetic field to the first layer. In an embodiment, the heating element is a resistor. In an embodiment, the heating element is a light source.

In an embodiment, the device includes a wire of a superconducting material, the wire being formed into a coil structure. In an embodiment, the heating element is one of a plurality of heating elements, each heating element configured to heat a corresponding portion of the first layer above a critical temperature.

In an embodiment, each portion of the first layer is configured to magnetically interact with a corresponding qubit of a plurality of qubits of the Q-processor such that a magnetic flux of each portion causes a change in a resonance frequency of the corresponding qubit. In an embodiment, the first layer produces the first magnetic flux while operating in a range of temperatures between 20 Kelvin and 0.01 Kelvin, inclusive of both ends of the range.

In an embodiment, the device includes a second layer configured to generate a magnetic field, the second layer comprising a material exhibiting superconductivity in a cryogenic temperature range. In an embodiment, the device includes a magnetic element disposed on a surface of a chip, wherein the first layer is formed on an opposite surface of the chip. In an embodiment, the qubit is formed on a first surface of the Q-processor chip. In an embodiment, the first layer is formed on an opposite surface of the Q-processor chip.

In an embodiment, the device includes a magnetic element configured to apply a magnetic field to the first layer, the magnetic element disposed on a first chip. In an embodiment, the first layer is disposed on a second chip.

An embodiment includes a method to fabricate a qubit tuning device. In an embodiment, the method includes forming a first layer configured to generate a magnetic field, the first layer comprising a material exhibiting superconductivity in a cryogenic temperature range. In an embodiment, the method includes forming a qubit on a Q-processor chip, wherein the first layer is configured to magnetically interact with the qubit such that a first magnetic flux of the first layer causes a first change in a first resonance frequency of the qubit by a first frequency shift value.

In an embodiment, the method includes forming a second layer configured to generate a magnetic field, the second layer comprising a material exhibiting superconductivity in a cryogenic temperature range. In an embodiment, the first layer produces the first magnetic flux while operating in a range of temperatures between 20 Kelvin and 0.01 Kelvin, inclusive of both ends of the range.

In an embodiment, the method includes disposing a magnetic element on a surface of a chip, wherein the first layer is formed on an opposite surface of the chip. In an embodiment, the qubit is formed on a first surface of the Q-processor chip. In an embodiment, the first layer is formed on an opposite surface of the Q-processor chip.

An embodiment includes a method of tuning a qubit. In an embodiment, the method includes generating a first magnetic field through a portion of a first layer, the first layer comprising a material exhibiting superconductivity in a cryogenic temperature range, the portion of the first layer above a critical temperature. In an embodiment, the method includes cooling the portion of the first layer at least to the critical temperature. In an embodiment, the method includes generating, in response to cooling the portion of the first layer at least to the critical temperature, a second magnetic field to magnetically interact with a qubit of a Q-processor chip such that a first magnetic flux of the first layer causes a first change in a first resonance frequency of the qubit by a first frequency shift value.

In an embodiment, the method includes heating with a heating element, prior to cooling the portion of the first layer, the portion of the first layer above the critical temperature. In an embodiment, the heating element is a resistor. In an embodiment, the heating element is embedded in the Q-processor chip.

In an embodiment, the method includes switching off, after cooling the portion, the first magnetic field through the portion of the first layer. In an embodiment, the method includes generating a third magnetic field through a second portion of the first layer.

In an embodiment, the method includes cooling the second portion of the first layer at or below the critical temperature. In an embodiment, the method includes generating, in response to cooling the second portion, a fourth magnetic field to magnetically interact with a second qubit of the Q-processor chip such that a second magnetic flux of the first layer causes a first change in a second resonance frequency of the second qubit by a second frequency shift value.

In an embodiment, the method includes maintaining the first magnetic field while cooling the portion of the first layer. In an embodiment, the method includes forming the qubit on a first surface of the Q-processor chip.

In an embodiment, the method includes forming the first layer on an opposite surface of the Q-processor chip. In an embodiment, the method includes forming a coil structure from a wire of superconducting material, the coil structure configured to generate the first magnetic field.

In an embodiment, the method includes forming the first layer on a first surface of a chip. In an embodiment, the method includes forming the coil structure on an opposite surface of the chip. In an embodiment, the method includes heating the portion of the first layer above the critical temperature using a light source.

In an embodiment, the critical temperature of the first layer is between 20 Kelvin and 0.01 Kelvin, inclusive of both ends of the range. In an embodiment, the method includes measuring a set of qubits to determine a set of qubit frequencies. In an embodiment, the method includes analyzing the set of qubit frequencies to determine instances of frequency crowding between the set of qubits.

In an embodiment, the method includes forming a plurality of coil structures, the plurality of coil structures configured to generate the first magnetic field. In an embodiment, the method includes heating a plurality of portions of the first layer above the critical temperature.

In an embodiment, the method includes generating a plurality of magnetic fields, each magnetic field corresponding to a portion of the plurality of portions of a first layer. In an embodiment, the method includes cooling the plurality of portions of the first layer at least to the critical temperature. In an embodiment, the method includes generating, in response to cooling the plurality of portions of the first layer at least to the critical temperature, a second plurality of magnetic fields to magnetically interact with a plurality of qubits of the Q-processor chip such that each magnetic flux of a plurality of magnetic fluxes of the first layer causes a first change in a first resonance frequency of a corresponding qubit of the plurality of qubits by a first frequency shift value.

An embodiment includes a computer usable program product. The computer usable program product includes a computer-readable storage device, and program instructions stored on the storage device.

In an embodiment, the computer usable code is stored in a computer readable storage device in a data processing system, and wherein the computer usable code is transferred over a network from a remote data processing system. In an embodiment, the computer usable code is stored in a computer readable storage device in a server data processing system, and wherein the computer usable code is downloaded over a network to a remote data processing system for use in a computer readable storage device associated with the remote data processing system An embodiment includes a computer system. The computer system includes a processor, a computer-readable memory, and a computer-readable storage device, and program instructions stored on the storage device for execution by the processor via the memory.

BRIEF DESCRIPTION OF THE DRAWINGS

The novel features believed characteristics of the invention are set forth in the appended claims. The invention itself, however, as well as a preferred mode of use, further objectives, and advantages thereof, will best be understood by reference to the following detailed description of the illustrative embodiments when read in conjunction with the accompanying drawings, wherein:

FIG. 25 depicts a flowchart of an example process for tuning a qubit in accordance with an illustrative embodiment.

DETAILED DESCRIPTION

Figure 1:
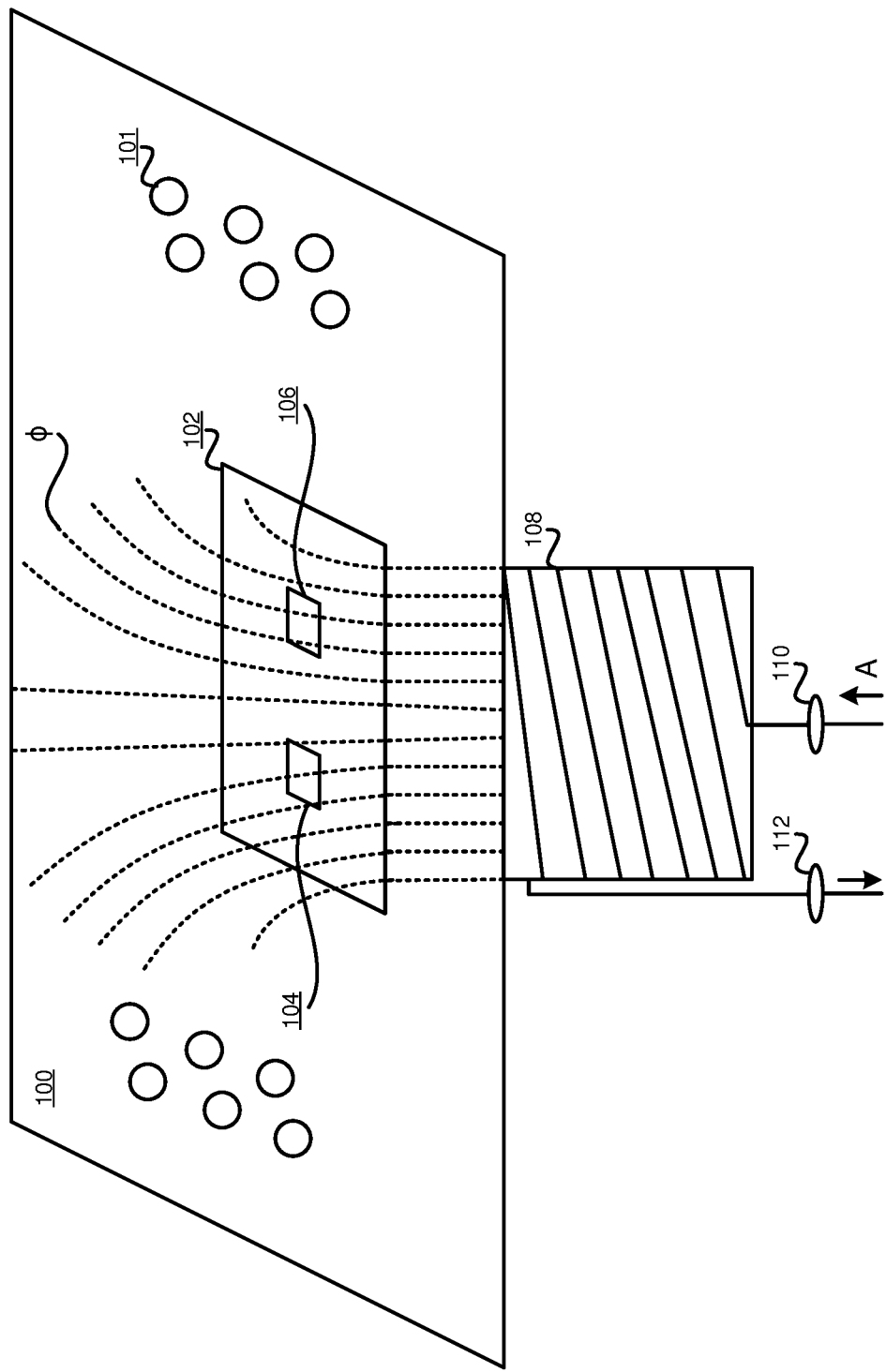
FIG. 1 depicts a block diagram of an example configuration of a prior-art of a global superconducting coil which can be improved in accordance with an illustrative embodiment.

The illustrative embodiments used to describe the invention generally address and solve the above-described needs for individually tunable qubits on a single chip. The illustrative embodiments provide a method and apparatus for qubit tuning using magnetic fields in superconductors.

An operation described herein as occurring with respect to a frequency or frequencies should be interpreted as occurring with respect to a signal of that frequency or frequencies. All references to a "signal" are references to a microwave signal unless expressly distinguished where used. Within the scope of the illustrative embodiments, temperatures at ninety-three Kelvin and below are regarded as cryogenic temperatures.

An embodiment provides a configuration of an apparatus for qubit tuning using magnetic fields in superconductors. Another embodiment provides a fabrication method for the apparatus for qubit tuning using magnetic fields in superconductors, such that the method can be implemented as a software application. The application implementing a fabrication method embodiment can be configured to operate in conjunction with an existing superconductor fabrication system—such as a lithography system.

For the clarity of the description, and without implying any limitation thereto, the illustrative embodiments are described using some example configurations. From this disclosure, those of ordinary skill in the art will be able to conceive many alterations, adaptations, and modifications of a described configuration for achieving a described purpose, and the same are contemplated within the scope of the illustrative embodiments.

Furthermore, simplified diagrams of the example qubits, coils or magnetic flux inducing structures, housing, casing, and other circuit components are used in the figures and the illustrative embodiments. In an actual fabrication or circuit, additional structures or component that are not shown or described herein, or structures or components different from those shown but for the purpose described herein may be present without departing the scope of the illustrative embodiments.

Furthermore, the illustrative embodiments are described with respect to specific actual or hypothetical components only as examples. The steps described by the various illustrative embodiments can be adapted for fabricating a circuit using a variety of components that can be purposed or repurposed to provide a function in a described manner, and such adaptations are contemplated within the scope of the illustrative embodiments.

The illustrative embodiments are described with respect to certain types of materials, electrical properties, steps, shapes, sizes, numerosity, frequencies, circuits, components, and applications only as examples. Any specific manifestations of these and other similar artifacts are not intended to be limiting to the invention. Any suitable manifestation of these and other similar artifacts can be selected within the scope of the illustrative embodiments.

The examples in this disclosure are used only for the clarity of the description and are not limiting to the illustrative embodiments. Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

With reference to FIG. 1, this figure depicts a block diagram of an example configuration of a prior-art of a global superconducting coil which can be improved in accordance with an illustrative embodiment. Printed circuit board (PCB) 100 includes microwave connectors 101, chip 102, and other components as may be needed in an implementation. Chip 102 is an example of a Q-processor comprising a plurality of qubits, e.g., qubits 104 and 106. In one embodiment, chip 102 can be mounted on printed circuit board 100 using a housing, a non-limiting example of which is described herein.

Global superconducting coil 108 is a flux inducing structure that is placed near chip 102 to provide biasing flux to all qubits on chip 102. Global superconducting coil 108 is distinct and separate from chip 102. Global superconducting coil 108 is formed by winding a superconducting wire with very thin insulating coating around a metallic core or rod, the two ends of the superconducting wire terminating at contacts 110 and 112. Electric Direct current (DC)—current A—flows through the coil to generate magnetic flux 0. Flux 0 change the output frequencies of qubits 104 and 106 by some amount. The flux dependence of the superconducting loop is periodic. The amount of flux that threads the qubit loops depend on their distances from global superconducting coil 108 and also on the background magnetic field which might be unequal for the different qubits. Generally, once the position of global superconducting coil 108 is fixed relative to chip 102, and the magnetic environment of chip 102 is stabilized in an installation, the changes in the frequencies of qubits 104 and 106 on chip 102 cannot be tuned independently of each other using a global superconducting coil 108.

Figure 2:
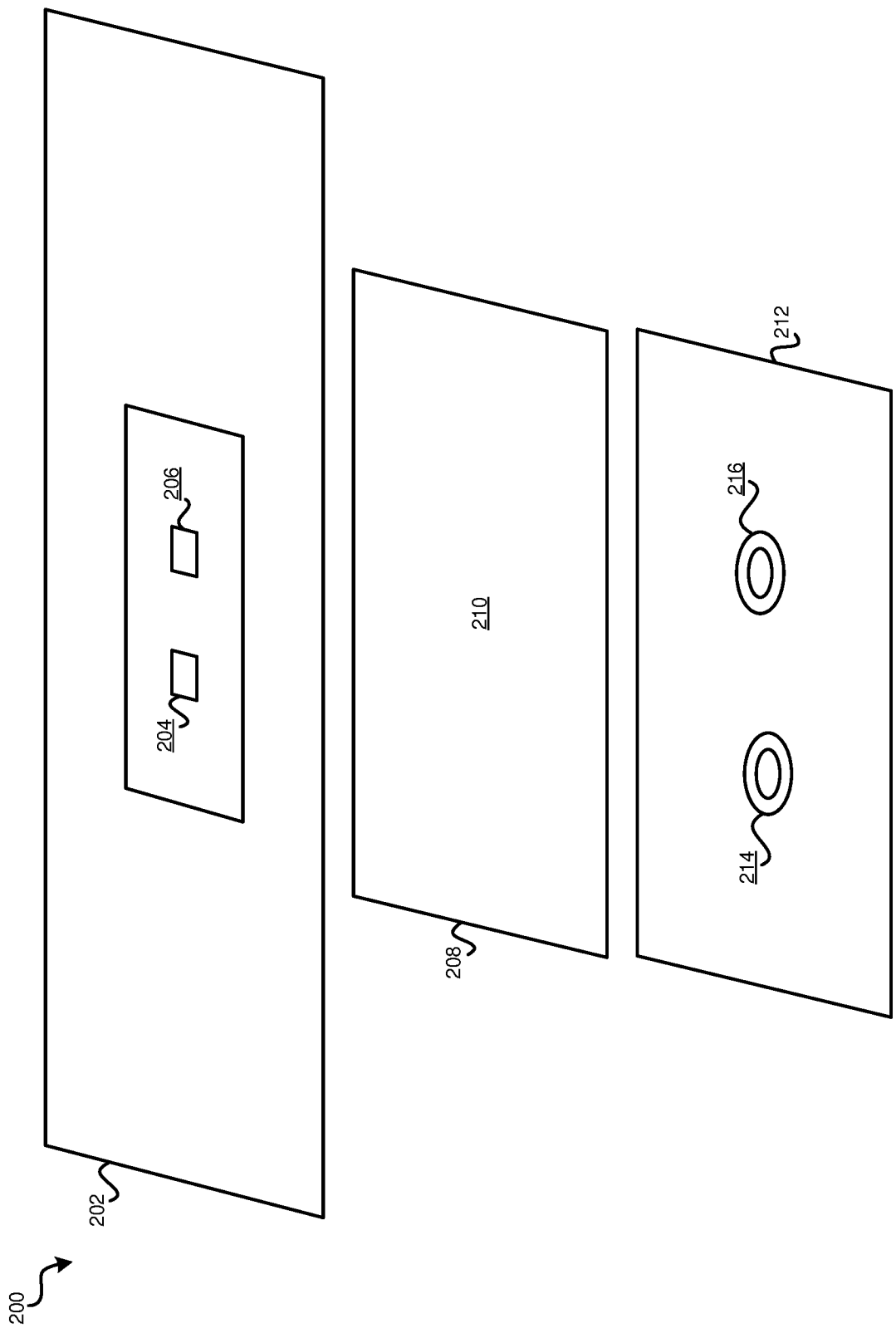
FIG. 2 depicts a block diagram of an example configuration of an apparatus for qubit tuning using magnetic fields in superconductors in accordance with an illustrative embodiment.

With reference to FIG. 2, this figure depicts a block diagram of an example configuration of an apparatus for qubit tuning using magnetic fields in superconductors in accordance with an illustrative embodiment. Configuration 200 includes chip 202 and other components as may be needed in an implementation. Chip 202 is an example of a Q-processor comprising a plurality of qubits, e.g., qubits 204 and 206.

In contrast with global superconducting coil 108 of FIG. 1, configuration 200 of FIG. 2 depicts chip 208 comprising a first layer 210. First layer 210 comprises a material that exhibits superconductivity in a portion of the cryogenic temperature range. In an embodiment, first layer 210 is a thin film layer. For example, first layer 210 can be a patterned film or a blanket film. In an embodiment, first layer 210 comprises a material that exhibits superconductivity in a temperature range of about 0.01-20 Kelvin, inclusive of both ends of the temperature range. For example, first layer 210 may be formed using a Type II superconductor material.

Coil 214 is configured to generate a magnetic field acting at the first layer 210. In an embodiment, a plurality of coils are configured to generate a magnetic field acting at the first layer 210. For example, a plurality of coils may be configured to generate a uniform magnetic field at the first layer 210. In an embodiment, each coil is configured to generate a specific magnetic field at a specific portion of the first layer 210. In an embodiment, each specific portion of the first layer 210 corresponds to an individual qubit on chip 202. For example, coil 214 generates a first magnetic field at a first portion of the first layer 210 and the first portion flux biases qubit 204 (and therefore are associated with qubit 204).

Hereinafter, the group of a qubit-specific coil, qubit-specific portion, and the corresponding qubit is referred to as an "Q group". An embodiment forms and positions such a qubit-specific coil relative to the corresponding portion of the first layer in such a manner that the magnetic field lines from the qubit-specific coil interact mainly with the corresponding portion and any magnetic interference with adjacent portions corresponding to other qubit-specific coils is maintained within an acceptable tolerance limit. An embodiment forms and positions such a qubit-specific portion relative to the corresponding qubit in such a manner that the magnetic field lines form the qubit-specific portion interact mainly with the corresponding qubit and any magnetic interference with adjacent qubits is maintained within an acceptable tolerance limit.

Each coil is optionally mounted on platform 212, which is a separate removable platform, e.g., a separate PCB. Platform 212 is usable to position each coil relative to first layer 210 in a movable manner, removable manner, or both. For example, in one embodiment, one coil may be moved or repositioned relative to the first layer, e.g., for improving the magnetic interaction with a portion of the first layer, reducing undesirable interference with a second portion of the first layer, or some combination of these and other objectives.

First layer 210 is configured to act as a permanent magnet in response to exposure to an external magnetic field generated by the coils and cooling below a critical temperature of the first layer 210. First layer 210 generates magnetic flux, which pass through—or threads—the superconducting loop of a qubit—which includes the inductance of a Josephson junction. The flux threading through the loop of the qubit causes a change in the inductance of the Josephson junction, which in turn results in a change in the resonance frequency of the qubit loop. Operating in this manner, a portion of first layer 210 interacts with qubit 204 in a manner to cause a substantial (greater than the threshold) amount of change or shift in qubit 204's frequency. In an embodiment, a second portion of first layer 210 operates relative to qubit 206 in a similar manner.

The depicted orientation of FIG. 2, which shows the qubit-specific coils 214-216 positioned below qubits 204-206, respectively, is a preferred orientation but is not intended to be limiting. As will become apparent from this disclosure, a qubit-specific coil can be oriented relative to the corresponding qubit in other orientations as well to achieve the qubit-specific frequency shifting effect on corresponding qubits. Different orientations of coils and combinations of (multiple) coils yield different amounts of fluxes ranging from significant to negligible. While some orientations might be useful in presently available superconducting Q-processor implementations, other orientations might find utility in other potential quantum devices which employ non-superconducting qubits.

Furthermore, in one embodiment, the magnetic flux of each qubit-specific coil is independently and dynamically controlled by adjusting the current supplied to the qubit-specific coil through a dedicated pair of contacts for that qubit-specific coil. In an embodiment, each qubit-specific coil is switched off after the first layer 210 is cooled at or below the critical temperature. In an embodiment, chip 212 is removed after the first layer 210 is cooled at or below the critical temperature. In another embodiment, chip 212 remains in place, but coils on chip 212 are no longer biased after the first layer 210 is cooled at or below the critical temperature.

Without implying that any particular embodiment provides any specific advantage or property, some of the advantages or properties that may be realized from implementing an embodiment in a specific manner include but are not limited to: 1—each coil is independent from other coils allowing the entire plurality of qubits to be tuned at the same time; 2—each coil primarily flux-biases one portion of the first layer; 3—first layer can be cooled below critical temperature; 4—chip 208 can be held in thermal equilibrium; and 5—chip 212 can be removed or coils 214-216 switched off while first layer 210 acts as permanent magnet.

Different quantum processing applications can have different requirements for flux-biasing the qubits. In some implementations, magnetic field biasing may have to be applied perpendicularly to the plane of superconducting qubits. In some other implementations, magnetic field biasing may have to be applied in parallel to the plane of superconducting qubits or other quantum devices. Such other requirements and implementations are contemplated within the scope of the illustrative embodiments. The coils in Q groups of an embodiment can be oriented differently relative to their corresponding portions of the superconducting material. The portions in Q groups of an embodiment can be oriented differently relative to their corresponding qubits. Furthermore, in one embodiment, a coil can have a one-to-one correspondence with a qubit; in another embodiment, a coil can have a one-to-n correspondence with a plurality of qubits; in another embodiment, n coils can have an n-to-one correspondence with a qubit where several coils correspond to a single qubit; in another embodiment, n coils can have an n-to-m correspondence with qubits where a set of n coils correspond to a set of m qubits. In another embodiment, a coil can have a zero-to-one correspondence with a qubit where no coil corresponds to certain qubits on a chip. A group of four coils can provide full vector control of the magnetic field at the location of the qubit, allowing to set all three spatial vector components (i.e., the magnitude and direction) of the magnetic field at the specific location of the corresponding qubit.

As can be seen from the variety of configurations disclosed, each qubit can be independently controlled for resonance frequency shift. Furthermore, the shift can be statically set or iteratively changed for an individual qubit on a multi-qubit chip. Additionally, qubits and coils can be oriented and grouped differently relative to one another to achieve the shifts, giving a variety of implementation alternatives in space-constrained implementations.

Figure 3:
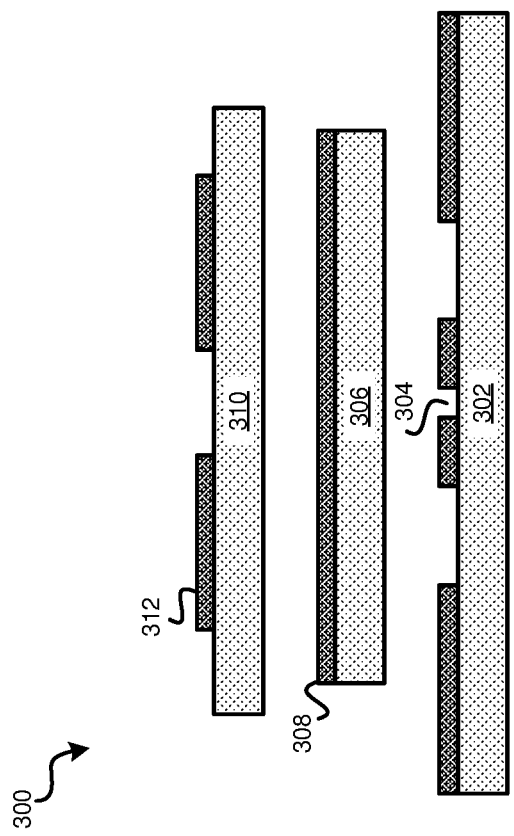
FIG. 3 depicts a cross-section of an example configuration of a qubit tuning device in accordance with an illustrative embodiment.

With reference to FIG. 3, this figure depicts a cross-section of an example configuration of a qubit tuning device in accordance with an illustrative embodiment. Configuration 300 depicts chip 302 comprising a qubit 304, chip 306 comprising a first layer 308, and chip 310 comprising a coil 312. In an embodiment, chip 306 is disposed between chip 310 and chip 302. First layer 308 comprises a material that exhibits superconductivity in a portion of the cryogenic temperature range. In an embodiment, first layer 308 comprises a material that exhibits superconductivity in a temperature range of about 1-10 Kelvin, inclusive of both ends of the temperature range. For example, first layer 308 may be formed using a Type II superconductor material. In an embodiment, first layer 308 is disposed on a surface of chip 306 facing chip 310. In an embodiment, coil 312 is disposed on a surface of chip 310 facing away from first layer 308.

Coil 312 is configured to generate a magnetic field acting at the first layer 308. In an embodiment, a plurality of coils are configured to generate a magnetic field acting at the first layer 308. For example, a plurality of coils may be configured to generate a uniform magnetic field at the first layer 308. In an embodiment, each coil is configured to generate a specific magnetic field at a specific portion of the first layer 308. In an embodiment, each specific portion of the first layer 308 corresponds to an individual qubit on chip 302. For example, coil 312 generates a first magnetic field at a first portion of the first layer 308 and the first portion flux biases qubit 304 (and therefore are associated with qubit 304).

Figure 4:
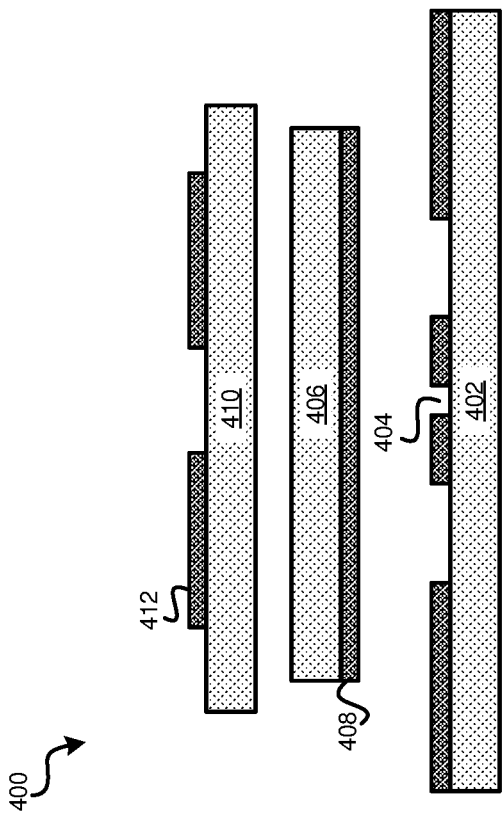
FIG. 4 depicts a cross-section of an example configuration of a qubit tuning device in accordance with an illustrative embodiment.

With reference to FIG. 4, this figure depicts a cross-section of an example configuration of a qubit tuning device in accordance with an illustrative embodiment. Configuration 400 depicts chip 402 comprising a qubit 404, chip 406 comprising a first layer 408, and chip 410 comprising a coil 412. Configuration 400 operates in a similar manner as configuration 300 in FIG. 3 and configuration 200 in FIG. 2. In an embodiment, first layer 408 is disposed on a surface of chip 406 facing qubit 404. In an embodiment, coil 412 is disposed on a surface of chip 410 facing away from first layer 408.

Figure 5:
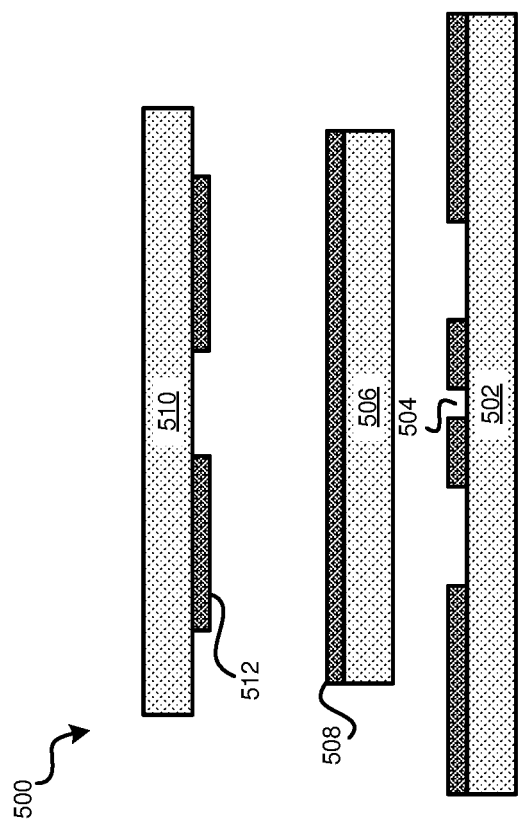
FIG. 5 depicts a cross-section of an example configuration of a qubit tuning device in accordance with an illustrative embodiment.

With reference to FIG. 5, this figure depicts a cross-section of an example configuration of a qubit tuning device in accordance with an illustrative embodiment. Configuration 500 depicts chip 502 comprising a qubit 504, chip 506 comprising a first layer 508, and chip 510 comprising a coil 512. Configuration 500 operates in a similar manner as configuration 300 in FIG. 3 and configuration 400 in FIG. 4. In an embodiment, first layer 508 is disposed on a surface of chip 506 facing coil 512. In an embodiment, coil 512 is disposed on a surface of chip 510 facing qubit 504.

Figure 6:
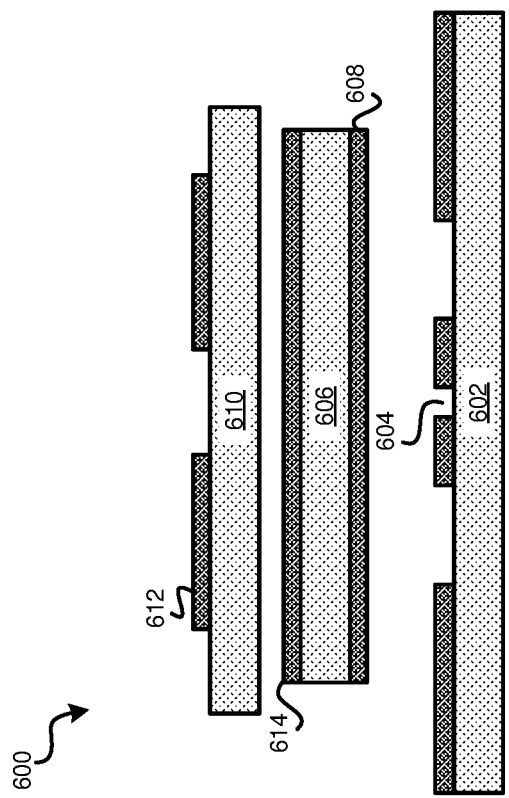
FIG. 6 depicts a cross-section of an example configuration of a qubit tuning device in accordance with an illustrative embodiment.

With reference to FIG. 6, this figure depicts a cross-section of an example configuration of a qubit tuning device in accordance with an illustrative embodiment. Configuration 600 depicts chip 602 comprising a qubit 604, chip 606 comprising a first layer 608 and a second layer 614, and chip 610 comprising a coil 612. Configuration 600 operates in a similar manner as configuration 300 in FIG. 3 and configuration 400 in FIG. 4. In an embodiment, chip 606 is disposed between chip 610 and chip 602. First layer 608 comprises a material that exhibits superconductivity in a portion of the cryogenic temperature range. In an embodiment, first layer 608 comprises a material that exhibits superconductivity in a temperature range of about 1-10 Kelvin, inclusive of both ends of the temperature range. For example, first layer 608 may be formed using a Type II superconductor material. In an embodiment, first layer 608 is disposed on a surface of chip 606 facing chip 602. In an embodiment, coil 612 is disposed on a surface of chip 610 facing away from first layer 608.

Second layer 614 comprises a material that exhibits superconductivity in a portion of the cryogenic temperature range. In an embodiment, second layer 614 comprises a material that exhibits superconductivity in a temperature range of about 1-10 Kelvin, inclusive of both ends of the temperature range. For example, second layer 614 may be formed using a Type II superconductor material. In an embodiment, second layer 614 is disposed on a surface of chip 606 facing chip 610.

Coil 612 is configured to generate a magnetic field acting at the first layer 608 and the second layer 614. In an embodiment, a plurality of coils are configured to generate a magnetic field acting at the first layer 608 and the second layer 614. For example, a plurality of coils may be configured to generate a uniform magnetic field at the first layer 608 and the second layer 614.

Figure 7:
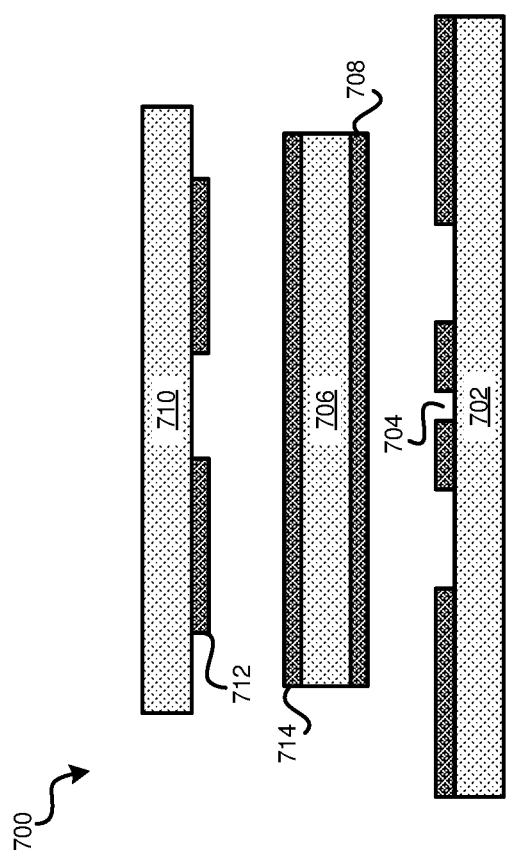
FIG. 7 depicts a cross-section of an example configuration of a qubit tuning device in accordance with an illustrative embodiment.

With reference to FIG. 7, this figure depicts a cross-section of an example configuration of a qubit tuning device in accordance with an illustrative embodiment. Configuration 700 depicts chip 702 comprising a qubit 704, chip 706 comprising a first layer 708 and a second layer 714, and chip 710 comprising a coil 712. Configuration 700 operates in a similar manner as configuration 300 in FIG. 3 and configuration 400 in FIG. 4. In an embodiment, chip 706 is disposed between chip 710 and chip 702. In an embodiment, coil 712 is disposed on a surface of chip 710 facing chip 706.

Figure 8:
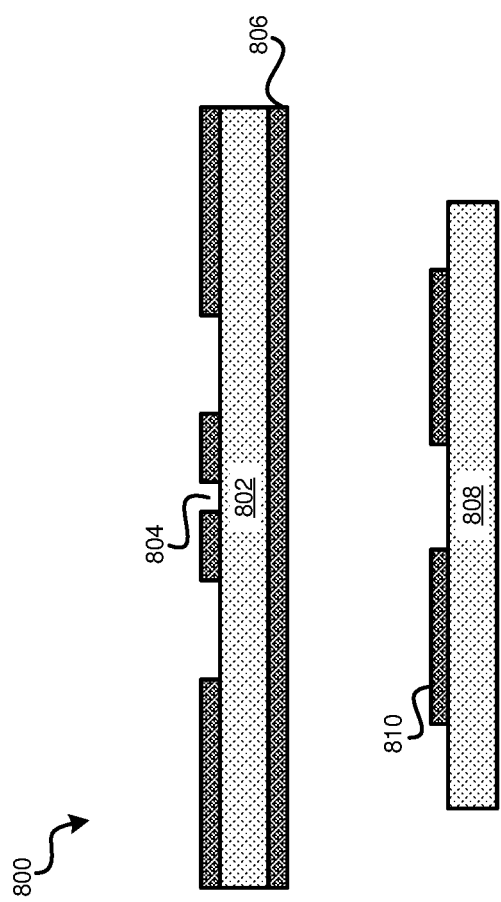
FIG. 8 depicts a cross-section of an example configuration of a qubit tuning device in accordance with an illustrative embodiment.

With reference to FIG. 8, this figure depicts a cross-section of an example configuration of a qubit tuning device in accordance with an illustrative embodiment. Configuration 800 depicts chip 802 comprising a qubit 804 and first layer 806, and chip 808 comprising a coil 810. Configuration 800 operates in a similar manner as configuration 300 in FIG. 3 and configuration 200 in FIG. 2. In an embodiment, qubit 804 is formed and configured on a first surface of chip 802. In an embodiment, chip 802 is disposed above chip 808. In an embodiment, first layer 806 is disposed on an opposite surface of chip 802 from qubit 804. In an embodiment, coil 810 is disposed on a surface of chip 808 facing first layer 806.

Figure 9:
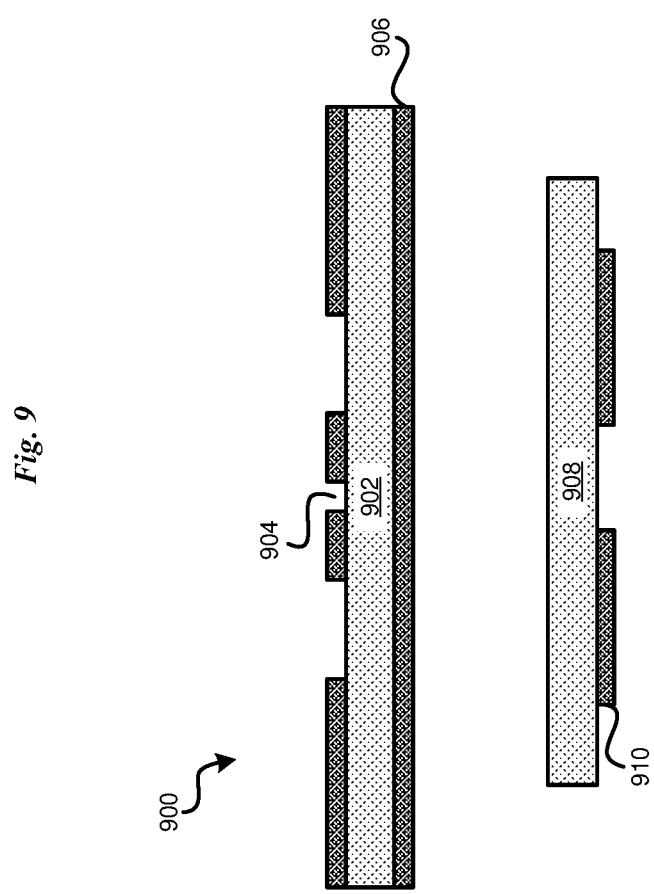
FIG. 9 depicts a cross-section of an example configuration of a qubit tuning device in accordance with an illustrative embodiment.

With reference to FIG. 9, this figure depicts a cross-section of an example configuration of a qubit tuning device in accordance with an illustrative embodiment. Configuration 900 depicts chip 902 comprising a qubit 904 and first layer 906, and chip 908 comprising a coil 910. Configuration 900 operates in a similar manner as configuration 300 in FIG. 3 and configuration 200 in FIG. 2. In an embodiment, qubit 904 is formed and configured on a first surface of chip 902. In an embodiment, first layer 906 is disposed on an opposite surface of chip 902 from qubit 904. In an embodiment, coil 910 is disposed on a surface of chip 908 facing away from first layer 906.

Figure 10:
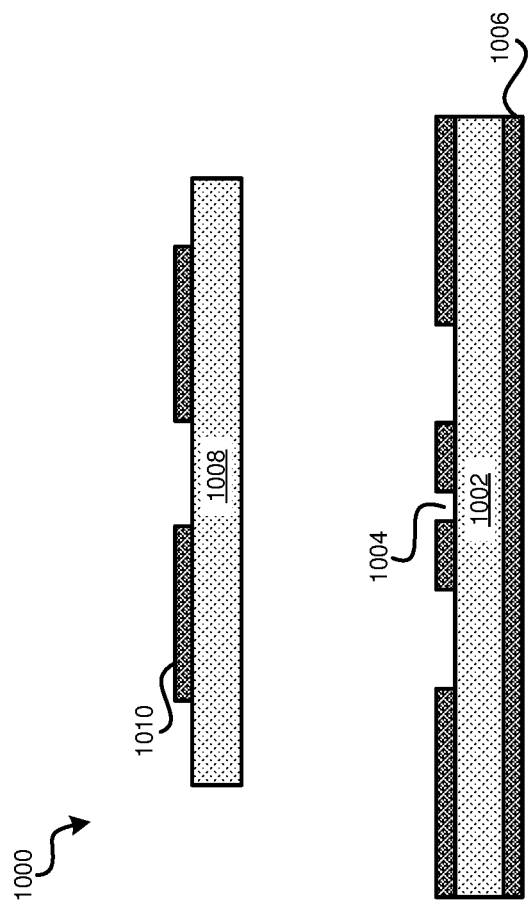
FIG. 10 depicts a cross-section of an example configuration of a qubit tuning device in accordance with an illustrative embodiment.

With reference to FIG. 10, this figure depicts a cross-section of an example configuration of a qubit tuning device in accordance with an illustrative embodiment. Configuration 1000 depicts chip 1002 comprising a qubit 1004 and first layer 1006, and chip 1008 comprising a coil 1010. Configuration 1000 operates in a similar manner as configuration 300 in FIG. 3 and configuration 200 in FIG. 2. In an embodiment, qubit 1004 is formed and configured on a first surface of chip 1002. In an embodiment, chip 1002 is disposed below chip 1008. In an embodiment, first layer 1006 is disposed on an opposite surface of chip 1002 from qubit 1004. In an embodiment, coil 1010 is disposed on a surface of chip 1008 facing away from first layer 1006.

Figure 11:
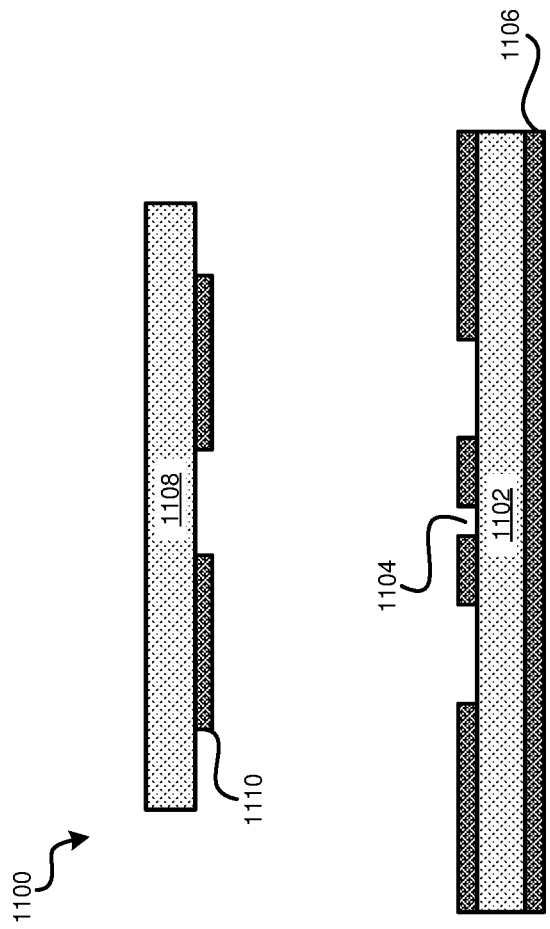
FIG. 11 depicts a cross-section of an example configuration of a qubit tuning device in accordance with an illustrative embodiment.

With reference to FIG. 11, this figure depicts a cross-section of an example configuration of a qubit tuning device in accordance with an illustrative embodiment. Configuration 1100 depicts chip 1102 comprising a qubit 1104 and first layer 1106, and chip 1108 comprising a coil 1110. Configuration 1100 operates in a similar manner as configuration 300 in FIG. 3 and configuration 200 in FIG. 2. In an embodiment, qubit 1104 is formed and configured on a first surface of chip 1102. In an embodiment, chip 1102 is disposed below chip 1108. In an embodiment, first layer 1006 is disposed on an opposite surface of chip 1102 from qubit 1104. In an embodiment, coil 1110 is disposed on a surface of chip 1108 facing chip 1102.

Figure 12:
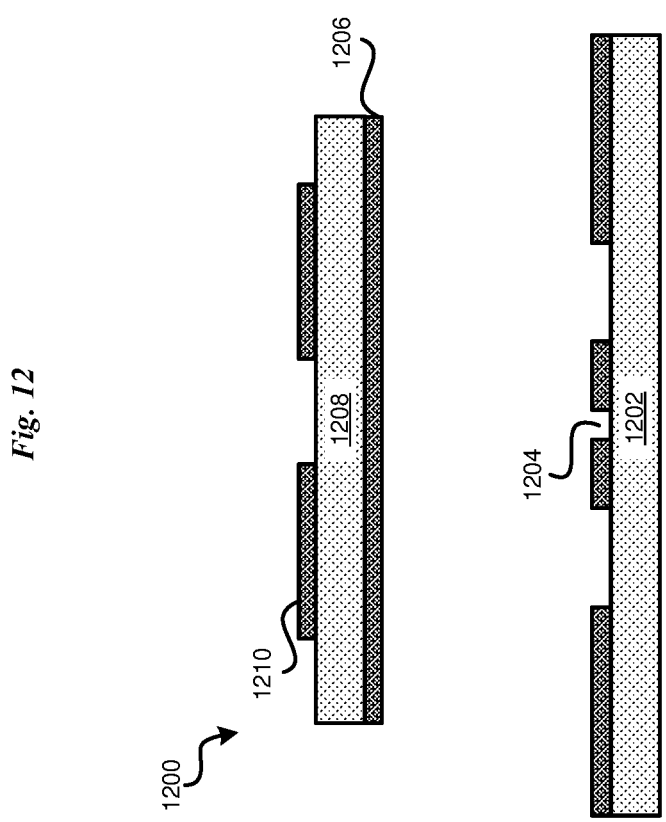
FIG. 12 depicts a cross-section of an example configuration of a qubit tuning device in accordance with an illustrative embodiment.

With reference to FIG. 12, this figure depicts a cross-section of an example configuration of a qubit tuning device in accordance with an illustrative embodiment. Configuration 1200 depicts chip 1202 comprising a qubit 1204 and chip 1208 comprising a first layer 1206 and a coil 1210. Configuration 1200 operates in a similar manner as configuration 300 in FIG. 3 and configuration 200 in FIG. 2. In an embodiment, first layer 1206 is formed and configured on a first surface of chip 1208. In an embodiment, chip 1202 is disposed below chip 1208. In an embodiment, coil 1210 is disposed on an opposite surface of chip 1208 from first layer 1206. In an embodiment, first layer 1206 is disposed on a surface of chip 1208 facing chip 1202.

Figure 13:
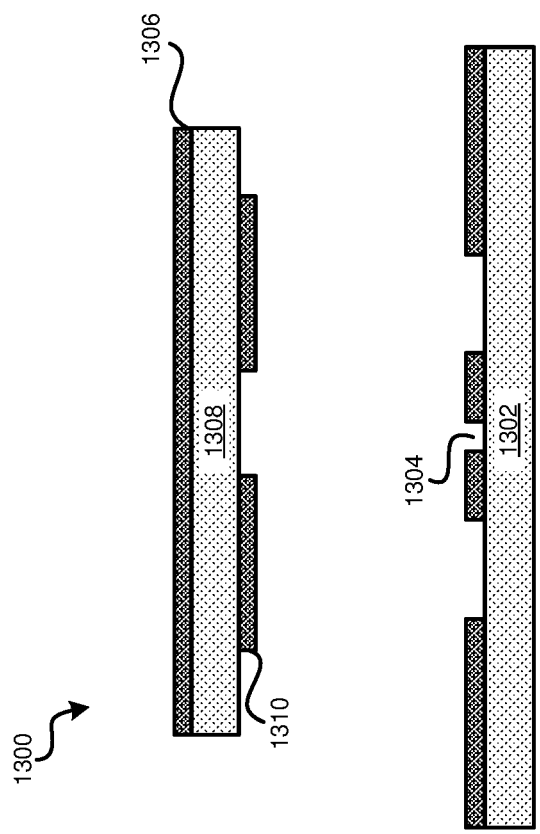
FIG. 13 depicts a cross-section of an example configuration of a qubit tuning device in accordance with an illustrative embodiment.

With reference to FIG. 13, this figure depicts a cross-section of an example configuration of a qubit tuning device in accordance with an illustrative embodiment. Configuration 1300 depicts chip 1302 comprising a qubit 1304 and chip 1308 comprising a first layer 1306 and a coil 1310. Configuration 1300 operates in a similar manner as configuration 300 in FIG. 3 and configuration 200 in FIG. 2. In an embodiment, first layer 1306 is formed and configured on a first surface of chip 1308. In an embodiment, chip 1302 is disposed below chip 1308. In an embodiment, coil 1310 is disposed on an opposite surface of chip 1308 from first layer 1306. In an embodiment, first layer 1306 is disposed on a surface of chip 1308 facing away from chip 1302.

Figure 14:
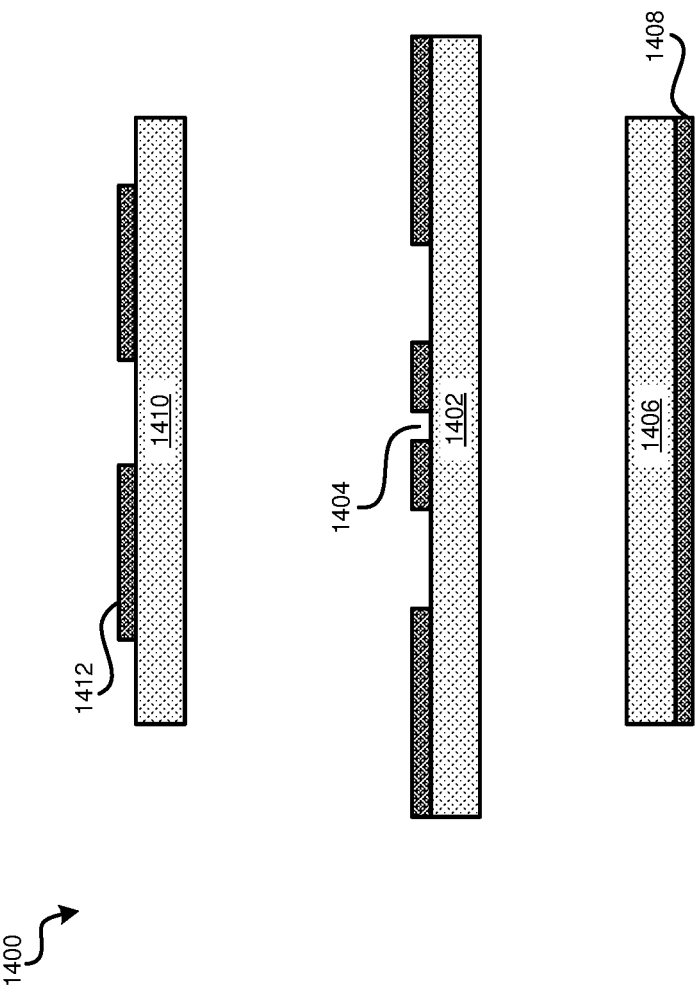
FIG. 14 depicts a cross-section of an example configuration of a qubit tuning device in accordance with an illustrative embodiment.

With reference to FIG. 14, this figure depicts a cross-section of an example configuration of a qubit tuning device in accordance with an illustrative embodiment. Configuration 1400 depicts chip 1402 comprising a qubit 1404, chip 1406 comprising a first layer 1408, and chip 1410 comprising a coil 1412. Configuration 1400 operates in a similar manner as configuration 300 in FIG. 3 and configuration 200 in FIG. 2. In an embodiment, chip 1402 is disposed between chip 1410 and chip 1402.

The orientations of FIGS. 2-14 are not intended to be limiting. From this disclosure, those of ordinary skill in the art will be able to conceive different orientations for qubit(s), layer(s), coil(s), and chips, as well as combinations of features from different configurations and the same are contemplated within the scope of the illustrative embodiments.

Figure 15:
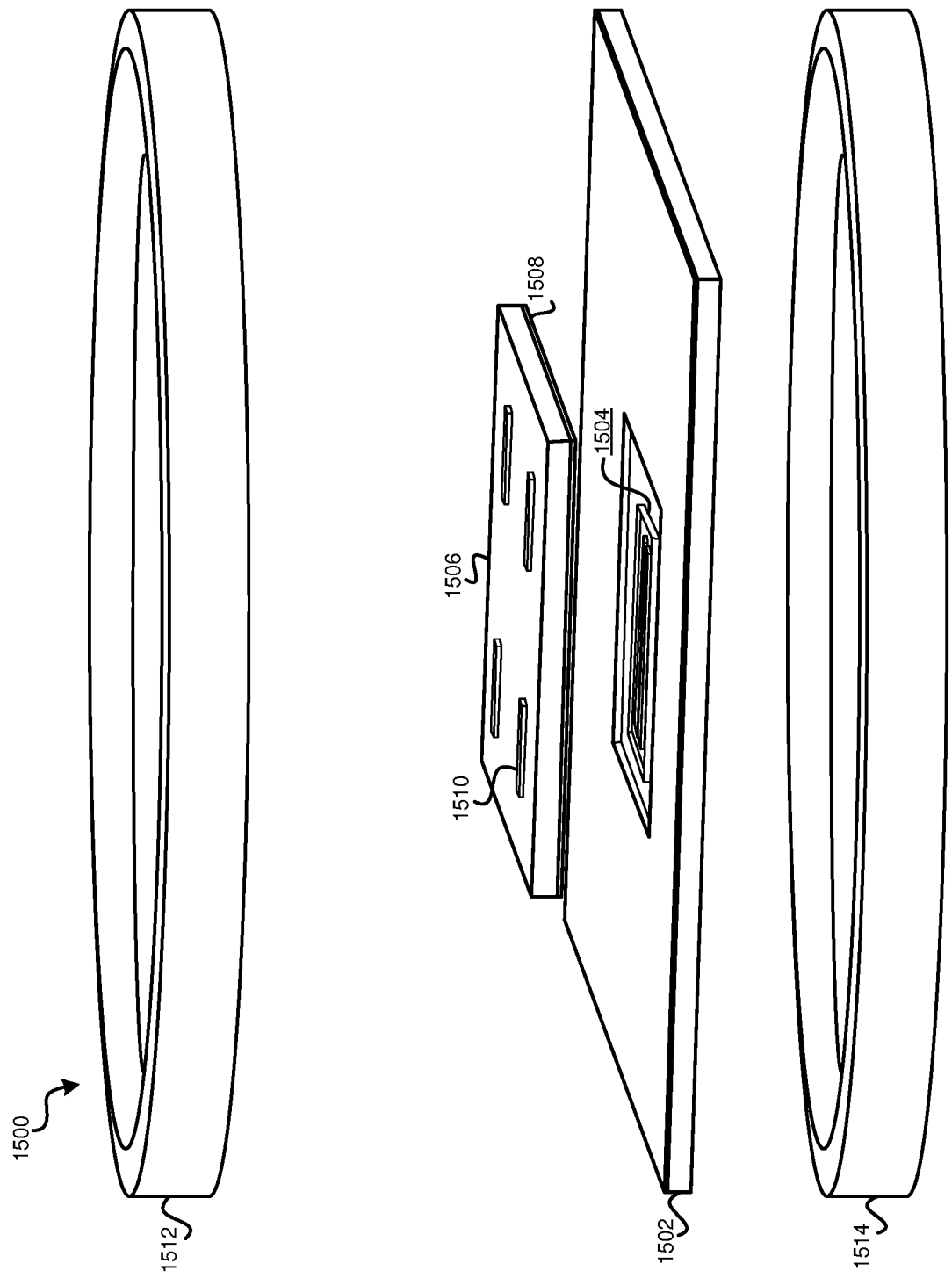
FIG. 15 depicts a block diagram of an example configuration of an apparatus for qubit tuning using magnetic fields in superconductors in accordance with an illustrative embodiment.

With reference to FIG. 15, this figure depicts a block diagram of an example configuration of an apparatus for qubit tuning using magnetic fields in superconductors in accordance with an illustrative embodiment. Configuration 1500 includes chip 1502 and other components as may be needed in an implementation. Chip 1502 is an example of a Q-processor comprising a plurality of qubits, e.g., qubit 1504.

In contrast with global superconducting coil 108 of FIG. 1, configuration 1500 of FIG. 15 depicts chip 1506 comprising a first layer 1508. First layer 1508 comprises a material that exhibits superconductivity in a portion of the cryogenic temperature range. In an embodiment, first layer 1508 is a thin film layer. For example, first layer 1508 can be a patterned film or a blanket film. In an embodiment, first layer 1508 comprises a material that exhibits superconductivity in a temperature range of about 1-10 Kelvin, inclusive of both ends of the temperature range. For example, first layer 1508 may be formed using a Type II superconductor material.

Coils 1512, 1514 are configured to generate a magnetic field acting at the first layer 1508. For example, coils 1512, 1514 may be configured to generate a uniform magnetic field at the first layer 1508. As another example, coils 1512, 1514 may be configured in a Helmholtz coil configuration.

Chip 1506 includes a plurality of resistors 1510 disposed on a surface opposite the first layer 1508. Each resistor is configured to heat a portion of the first layer 1508 above the critical temperature of the first layer 1508. In an embodiment, each resistor is operated independently of other resistors on chip 1506. In an embodiment, each resistor corresponds to a separate portion of the first layer 1508. For example, each resistor can heat a portion of the first layer 1508 associated with a different qubit on chip 1502.

First layer 1508 is configured to act as a permanent magnet in response to exposure to an external magnetic field generated by the coils and cooling below a critical temperature of the first layer 1508. First layer 1508 generates magnetic flux, which pass through—or threads—the superconducting loop of a qubit—which includes the inductance of a Josephson junction. The flux threading through the loop of the qubit causes a change in the inductance of the Josephson junction, which in turn results in a change in the resonance frequency of the qubit loop. Operating in this manner, a portion of first layer 1508 interacts with qubit 1504 in a manner to cause a substantial (greater than the threshold) amount of change or shift in qubit 1504's frequency.

The depicted orientation of FIG. 15, which shows the chip 1506 positioned above chip 1502, respectively, is a preferred orientation but is not intended to be limiting. Different orientations yield different amounts of fluxes ranging from significant to negligible. While some orientations might be useful in presently available superconducting q-processor implementations, other orientations might find utility in other potential quantum devices which employ non-superconducting qubits.

Furthermore, in one embodiment, the heat generated by each resistor is independently and dynamically controlled by adjusting the current supplied to the resistor through a dedicated pair of contacts for that resistor. In an embodiment, each resistor is switched off after the magnetic field generated by coils 1512, 1514 stabilizes and the portion of the first layer 1508 heated by the resistor falls below a critical temperature. In an embodiment, the heated portion of first layer 1508 is cooled to at or below the critical temperature to pin the generated magnetic field in the portion of the first layer 1508. In an embodiment, the process of heating above the critical temperature and cooling at or below the critical temperature is repeated for other portions of the first layer 1508 using corresponding resistors. In an embodiment, the generated magnetic field is changed before heating a subsequent portion of the first layer 1508 in order to tune a different qubit at a different frequency.

Without implying that any particular embodiment provides any specific advantage or property, some of the advantages or properties that may be realized from implementing an embodiment in a specific manner include but are not limited to: 1—only one coil needed to generate magnetic field; and 2—coil can be switched off while first layer acts as permanent magnet.

Different quantum processing applications can have different requirements for flux-biasing the qubits. In some implementations, magnetic field biasing may have to be applied perpendicularly to the plane of superconducting qubits. In some other implementations, magnetic field biasing may have to be applied in parallel to the plane of superconducting qubits or other quantum devices. Such other requirements and implementations are contemplated within the scope of the illustrative embodiments. A group of four locations of generated magnetic field (in first layer 1508) can provide full vector control of the magnetic field at the location of a qubit, enabling to set all three spatial vector components (i.e., the magnitude and direction) of the magnetic field at the specific location of the corresponding qubit.

As can be seen from the variety of configurations disclosed, each qubit can be independently controlled for resonance frequency shift. Furthermore, the shift can be statically set or iteratively changed for an individual qubit on a multi-qubit chip.

Figure 16:
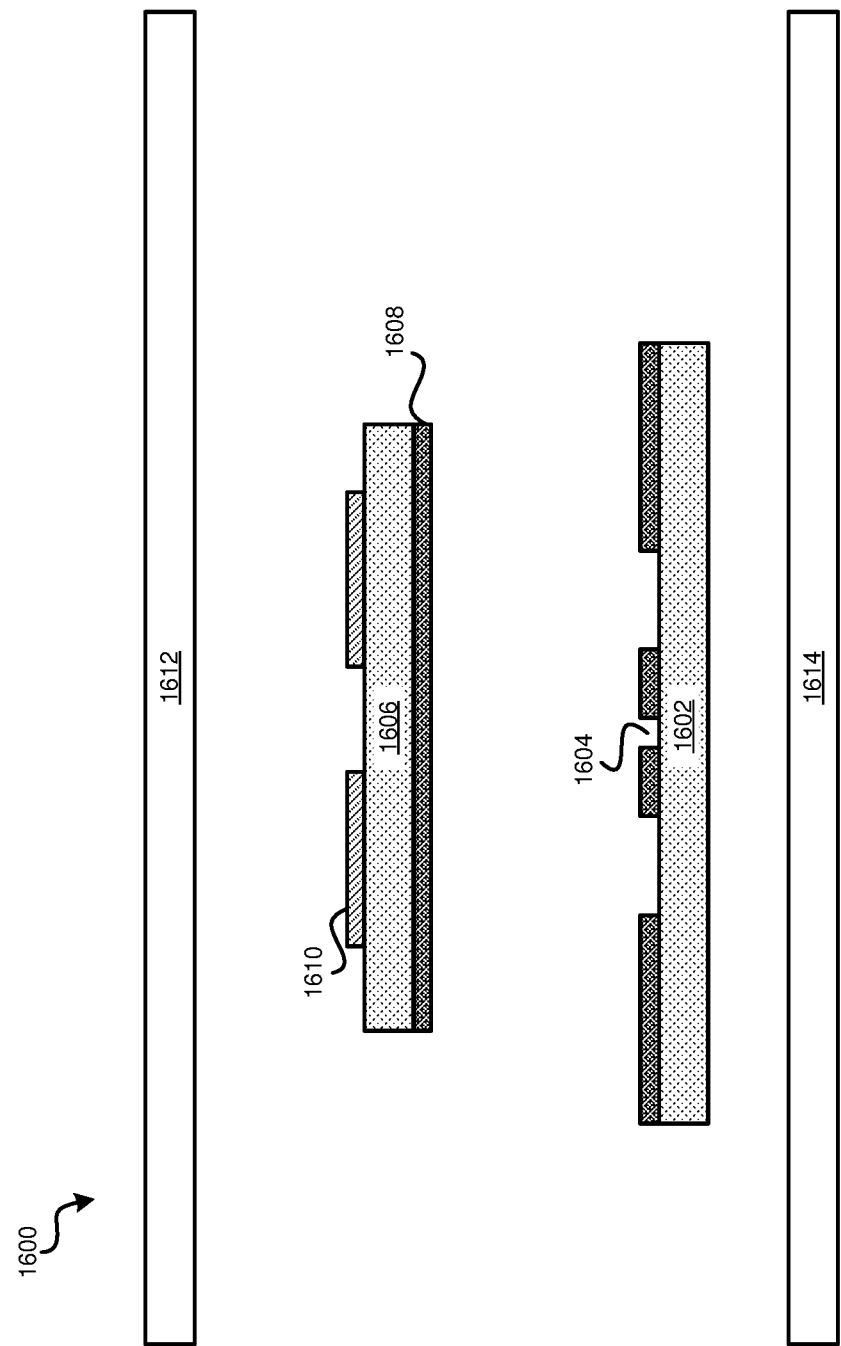
FIG. 16 depicts a cross-section of an example configuration of a qubit tuning device in accordance with an illustrative embodiment.

With reference to FIG. 16, this figure depicts a cross-section of an example configuration of a qubit tuning device in accordance with an illustrative embodiment. Configuration 1600 depicts chip 1602 comprising a qubit 1604, chip 1606 comprising a first layer 1608 and a resistor 1610, and coils 1612-1614. Configuration 1600 operates in a similar manner as configuration 1500 in FIG. 15. In an embodiment, chip 1602 is disposed below chip 1606. First layer 1608 comprises a material that exhibits superconductivity in a portion of the cryogenic temperature range. In an embodiment, first layer 1608 comprises a material that exhibits superconductivity in a temperature range of about 1-10 Kelvin, inclusive of both ends of the temperature range. For example, first layer 1608 may be formed using a Type II superconductor material and may be a patterned film or a blanket film. In an embodiment, first layer 1608 is disposed on a surface of chip 1606 facing chip 1602. In an embodiment, resistor 1610 is disposed on an opposite surface of chip 1606 from first layer 1608.

Resistor 1610 is configured to heat a portion of the first layer 1608 above the critical temperature. In an embodiment, each resistor is configured to heat a separate portion of the first layer. Coils 1612-1614 are configured to generate a magnetic field acting at the first layer 1608. For example, coils may be configured to generate a uniform magnetic field at the first layer 1608.

Figure 17:
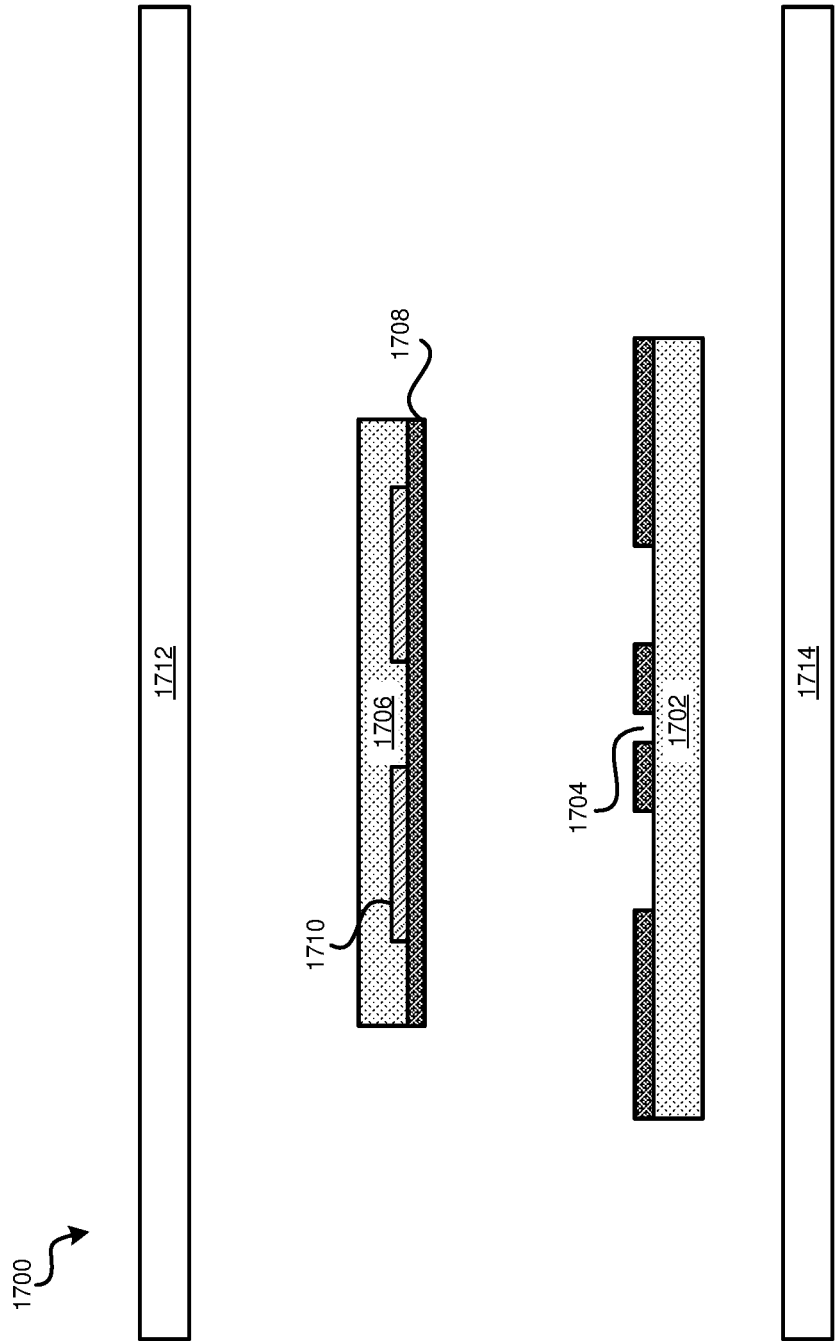
FIG. 17 depicts a cross-section of an example configuration of a qubit tuning device in accordance with an illustrative embodiment.

With reference to FIG. 17, this figure depicts a cross-section of an example configuration of a qubit tuning device in accordance with an illustrative embodiment. Configuration 1700 depicts chip 1702 comprising a qubit 1704, chip 1706 comprising a first layer 1708 and a resistor 1710, and coils 1712-1714. Configuration 1700 operates in a similar manner as configuration 1500 in FIG. 15. In an embodiment, chip 1702 is disposed below chip 1706. In an embodiment, resistor 1710 is embedded in chip 1706. In an embodiment, first layer 1708 is disposed on a surface of chip 1706 facing chip 1702.

Figure 18:
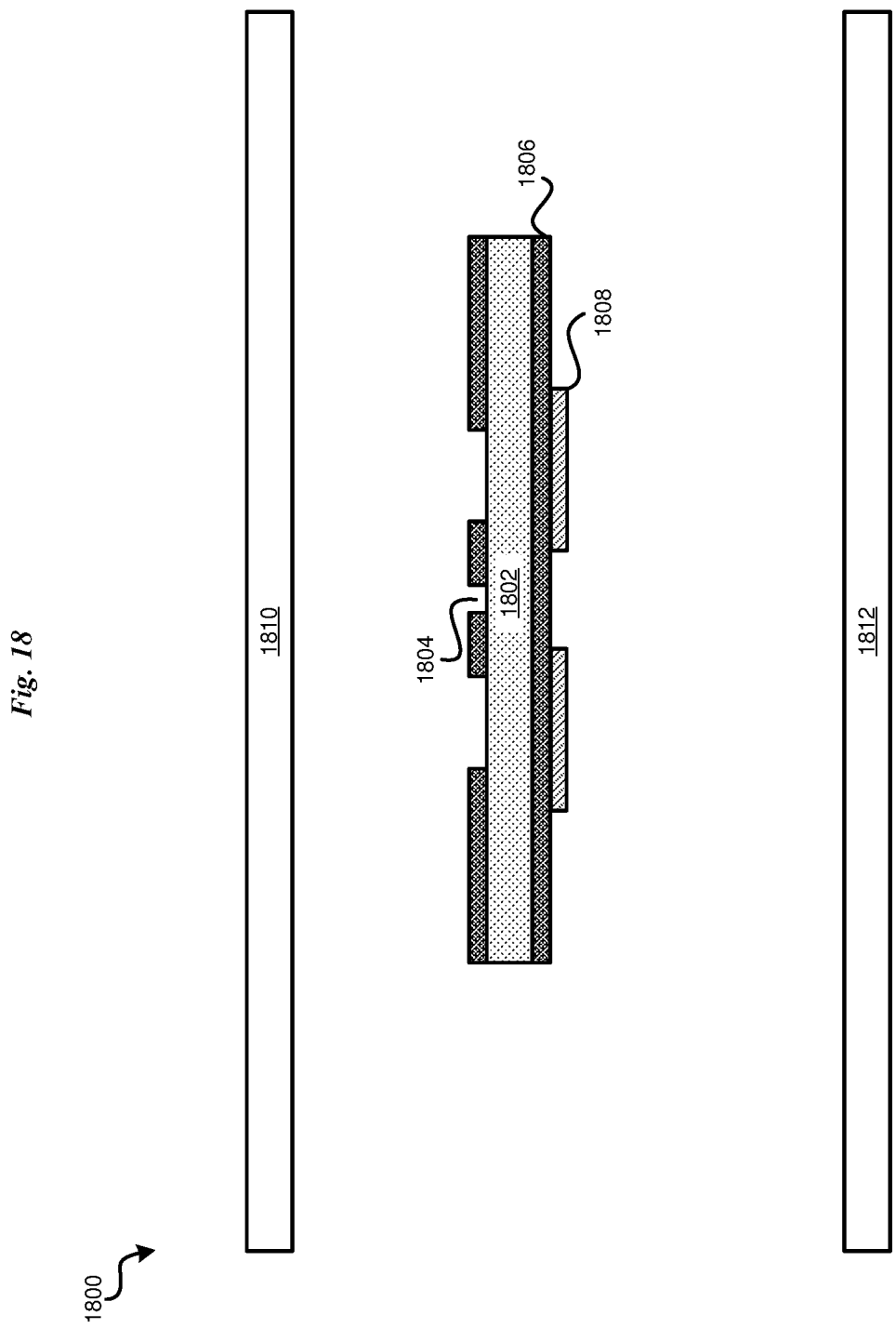
FIG. 18 depicts a cross-section of an example configuration of a qubit tuning device in accordance with an illustrative embodiment.

With reference to FIG. 18, this figure depicts a cross-section of an example configuration of a qubit tuning device in accordance with an illustrative embodiment. Configuration 1800 depicts chip 1802 comprising a qubit 1804, a first layer 1806, and a resistor 1808, and coils 1810-1812. Configuration 1800 operates in a similar manner as configuration 1500 in FIG. 15 In an embodiment, qubit 1804 is formed and disposed on a first surface of the chip 1802. In an embodiment, first layer 1806 is disposed on an opposite surface of chip 1802. In an embodiment, resistor 1808 is disposed on first layer 1806.

Figure 19:
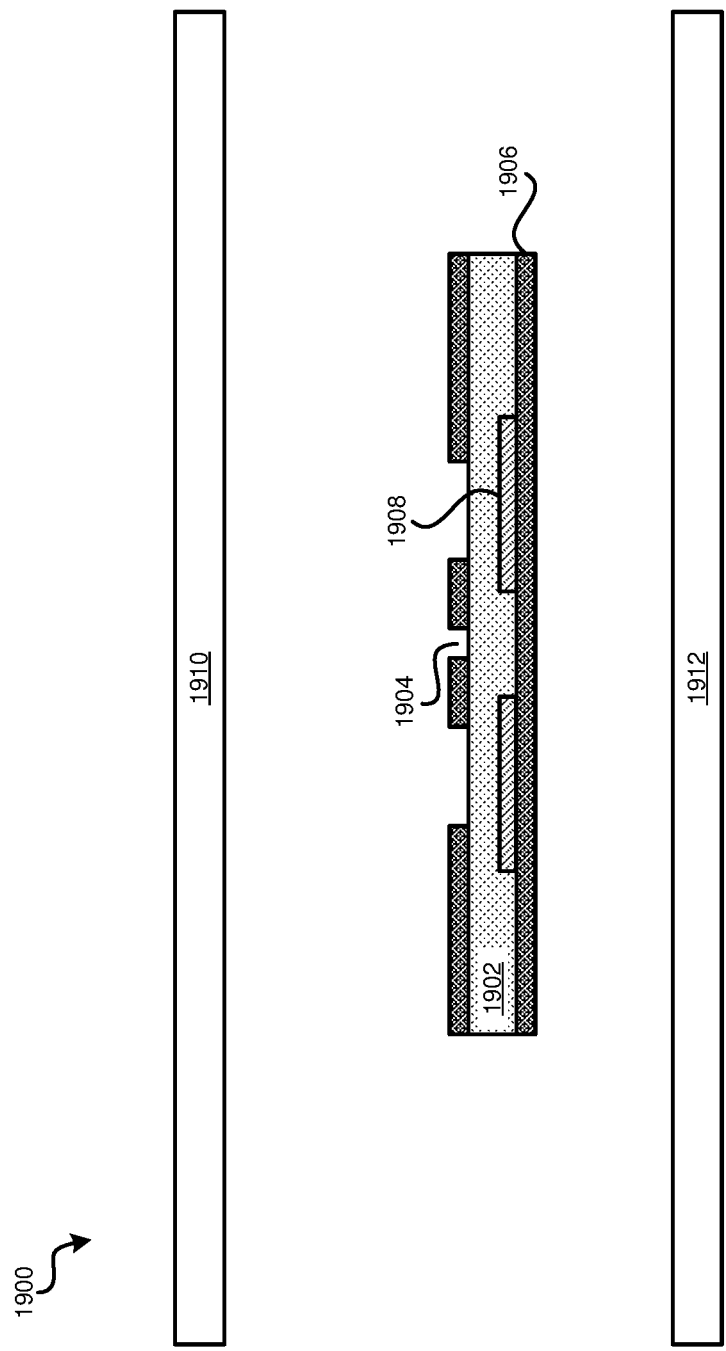
FIG. 19 depicts a cross-section of an example configuration of a qubit tuning device in accordance with an illustrative embodiment.

With reference to FIG. 19, this figure depicts a cross-section of an example configuration of a qubit tuning device in accordance with an illustrative embodiment. Configuration 1900 depicts chip 1902 comprising a qubit 1904, a first layer 1906, and a resistor 1908, and coils 1910-1912. Configuration 1900 operates in a similar manner as configuration 1500 in FIG. 15. In an embodiment, qubit 1904 is formed and disposed on a first surface of the chip 1902. In an embodiment, first layer 1906 is disposed on an opposite surface of chip 1902. In an embodiment, resistor 1908 is embedded in chip 1902.

The orientations of FIGS. 15-19 are not intended to be limiting. From this disclosure, those of ordinary skill in the art will be able to conceive different orientations for qubit(s), layer(s), resistor(s), coil(s), and chips, as well as combinations of features from different figures, and the same are contemplated within the scope of the illustrative embodiments.

Figure 20:
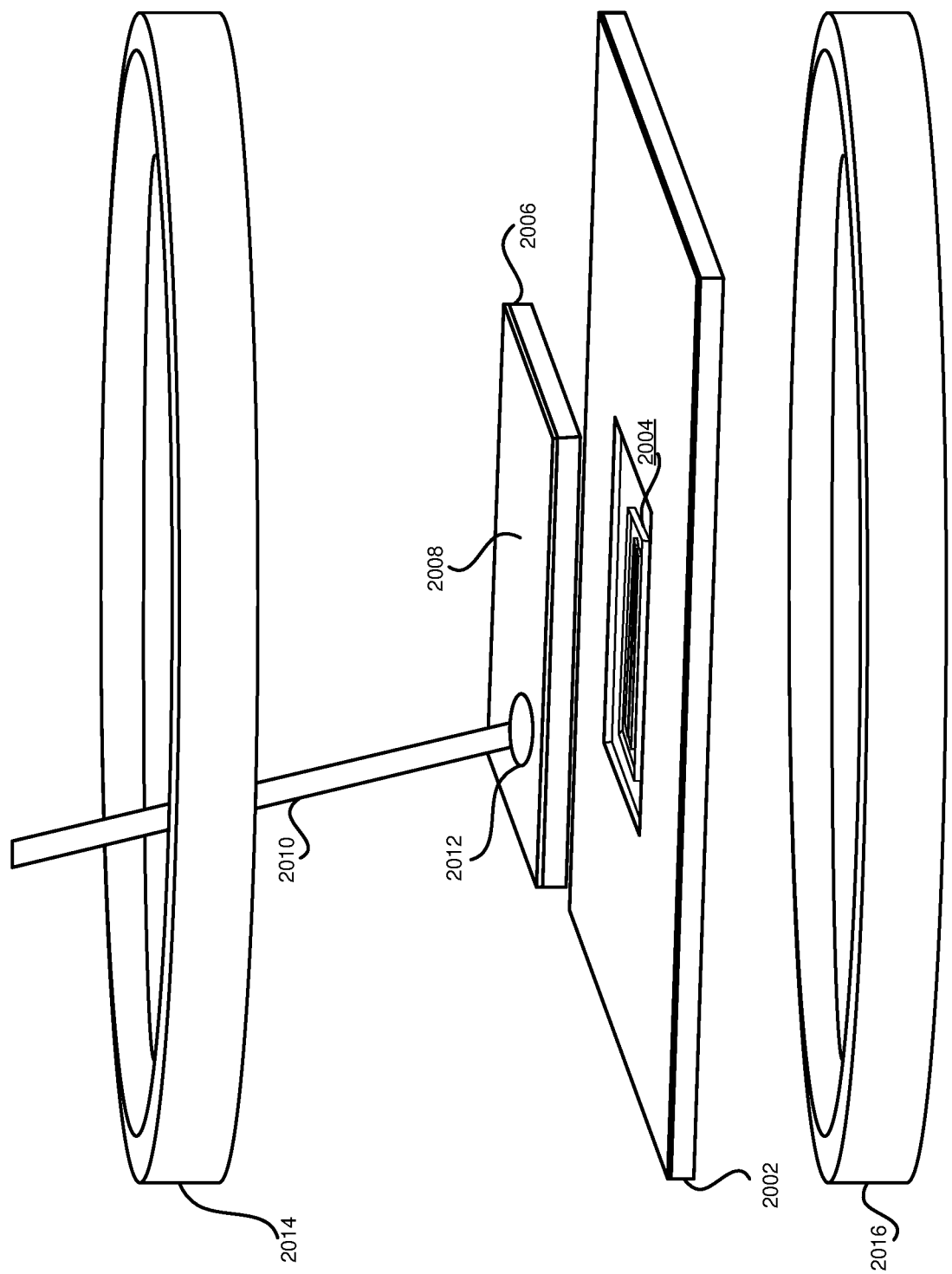
FIG. 20 depicts a block diagram of an example configuration of an apparatus for qubit tuning using magnetic fields in superconductors in accordance with an illustrative embodiment.

With reference to FIG. 20, this figure depicts a block diagram of an example configuration of an apparatus for qubit tuning using magnetic fields in superconductors in accordance with an illustrative embodiment. Configuration 2000 includes chip 2002 and other components as may be needed in an implementation. Chip 2002 is an example of a Q-processor comprising a plurality of qubits, e.g., qubit 2004.

In contrast with global superconducting coil 108 of FIG. 1, configuration 2000 of FIG. 20 depicts chip 2006 comprising a first layer 2008. First layer 2008 comprises a material that exhibits superconductivity in a portion of the cryogenic temperature range. In an embodiment, first layer 2008 is a thin film layer. For example, first layer 2008 can be a patterned film or a blanket film. In an embodiment, first layer 2008 comprises a material that exhibits superconductivity in a temperature range of about 1-10 Kelvin, inclusive of both ends of the temperature range. For example, first layer 2008 may be formed using a Type II superconductor material.

Coils 2014, 2016 are configured to generate a magnetic field acting at the first layer 2008. For example, coils 2014, 2016 may be configured to generate a uniform magnetic field at the first layer 2008. As another example, coils 2014, 2016 may be configured in a Helmholtz coil configuration.

Laser 2010 is configured to generate heat at a portion 2012 of first layer 2008. Light source (e.g., laser) 2010 is configured to locally heat a portion of the first layer 2008 above the critical temperature of the first layer 2008. In an embodiment, a light absorbing layer (not shown) is placed on chip 2006 on the chip face that the light impinges on. In an embodiment, a laser source generating the laser can be moved and positioned to target different portions of the first layer 2008. For example, laser 2010 can heat a portion of the first layer 2008 associated with a different qubit on chip 2002.

First layer 2008 is configured to act as a permanent magnet in response to exposure to an external magnetic field generated by the coils and cooling below a critical temperature of the first layer 2008. First layer 2008 generates magnetic flux, which pass through—or threads—the superconducting loop of a qubit—which includes the inductance of a Josephson junction. The flux threading through the loop of the qubit causes a change in the inductance of the Josephson junction, which in turn results in a change in the resonance frequency of the qubit that comprises the loop. Operating in this manner, a portion (or a group of portions) of first layer 2008 interacts with qubit 2004 in a manner to cause a substantial (greater than the threshold) amount of change or shift in qubit 2004's frequency.

The depicted orientation of FIG. 20, which shows the chip 2006 positioned above chip 2002, respectively, is a preferred orientation but is not intended to be limiting. Different orientations yield different amounts of fluxes ranging from significant to negligible. While some orientations might be useful in presently available superconducting q-processor implementations, other orientations might find utility in other potential quantum devices which employ non-superconducting qubits.

Furthermore, in one embodiment, the heat generated by the laser is independently and dynamically controlled. In an embodiment, the light source or laser 2010 is switched off after the magnetic field generated by coils 2014, 2016 stabilizes and the portion of the first layer 2008 heated by the light beam or laser 2010 falls below a critical temperature. In an embodiment, the heated portion of first layer 2008 is cooled to at or below the critical temperature to pin the generated magnetic field in the portion of the first layer 2008. In an embodiment, the process of heating above the critical temperature and cooling at or below the critical temperature is repeated for other portions of the first layer 2008 using light source or laser 2010. In an embodiment, the generated magnetic field is changed before heating a subsequent portion of the first layer 2008 in order to tune a different qubit at a different frequency.

Without implying that any particular embodiment provides any specific advantage or property, some of the advantages or properties that may be realized from implementing an embodiment in a specific manner include but are not limited to: 1—only one coil needed to generate magnetic field; and 2—coil can be switched off while first layer acts as permanent magnet.

Different quantum processing applications can have different requirements for flux-biasing the qubits. In some implementations, magnetic field biasing may have to be applied perpendicularly to the plane of superconducting qubits. In some other implementations, magnetic field biasing may have to be applied in parallel to the plane of superconducting qubits or other quantum devices. Such other requirements and implementations are contemplated within the scope of the illustrative embodiments.

As can be seen from the variety of configurations disclosed, each qubit can be independently controlled for resonance frequency shift. Furthermore, the shift can be statically set or iteratively changed for an individual qubit on a multi-qubit chip.

Figure 21:
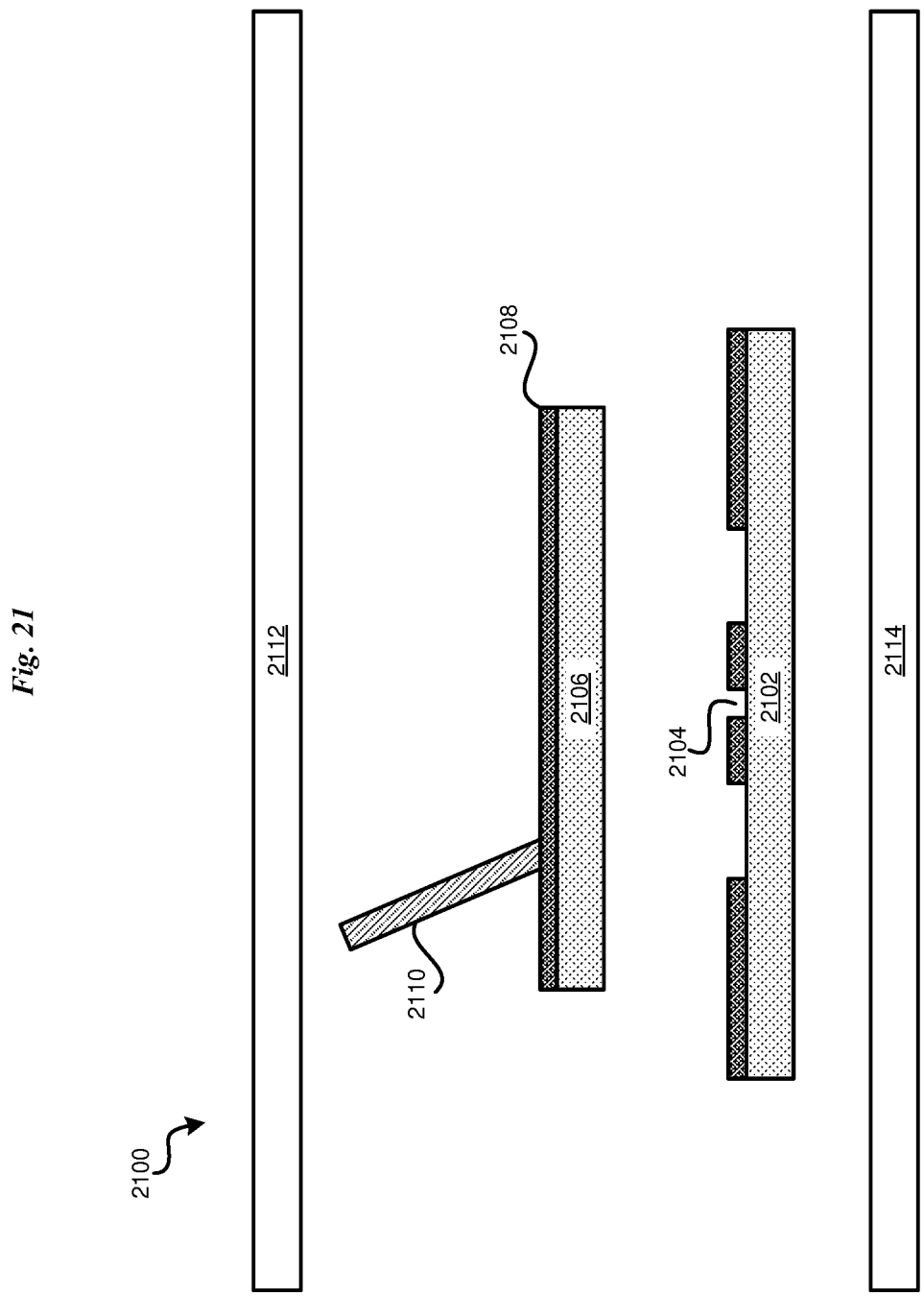
FIG. 21 depicts a cross-section of an example configuration of a qubit tuning device in accordance with an illustrative embodiment.

With reference to FIG. 21, this figure depicts a cross-section of an example configuration of a qubit tuning device in accordance with an illustrative embodiment. Configuration 2100 depicts chip 2102 comprising a qubit 2104, chip 2106 comprising a first layer 2108, and coils 2112, 2114. Configuration 2100 operates in a similar manner as configuration 2000 in FIG. 20. In an embodiment, first layer 2108 is formed and disposed on a first surface of chip 2106. In an embodiment, a light absorbing layer is deposited on top of the first layer 2108. In an embodiment, chip 2102 is disposed below chip 2106. In an embodiment, coils 2112, 2114 are configured to generate a magnetic field. In an embodiment, light beam or laser 2110 is configured to heat a portion of the first layer 2108.

Figure 22:
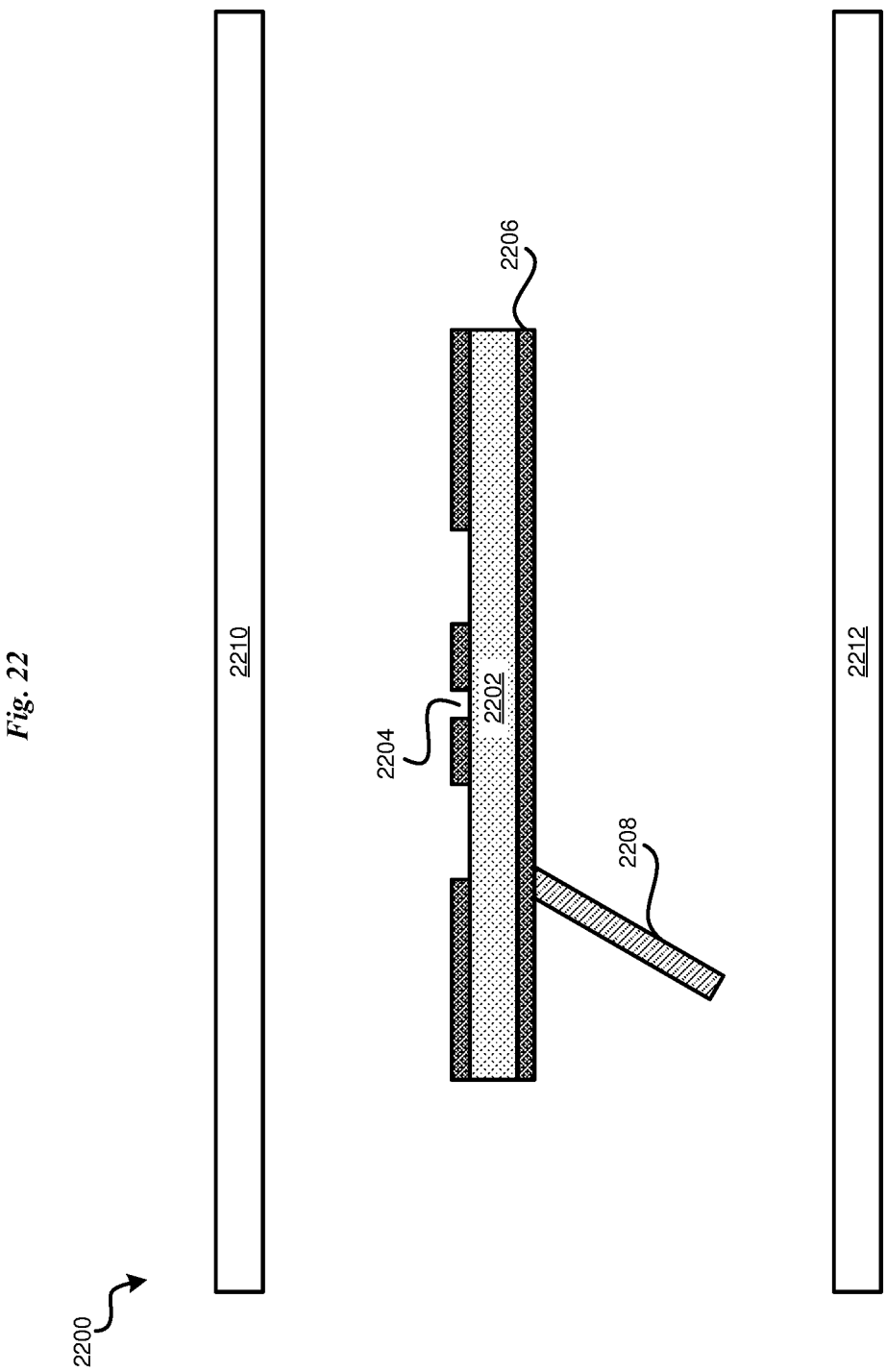
FIG. 22 depicts a cross-section of an example configuration of a qubit tuning device in accordance with an illustrative embodiment.

With reference to FIG. 22, this figure depicts a cross-section of an example configuration of a qubit tuning device in accordance with an illustrative embodiment. Configuration 2200 depicts chip 2202 comprising a qubit 2204, a first layer 2206, and coils 2210, 2212. Configuration 2200 operates in a similar manner as configuration 2000 in FIG. 20. In an embodiment, qubit 2204 is formed and disposed on a first surface of chip 2202. In an embodiment, first layer 2206 is formed and disposed on an opposite surface of chip 2202 from qubit 2204. In an embodiment, a light absorbing layer is deposited on the surface of the first layer 2206. In an embodiment, coils 2210, 2212 are configured to generate a magnetic field. In an embodiment, laser 2208 is configured to heat a portion of the first layer 2206.

The orientations of FIGS. 20-22 are not intended to be limiting. From this disclosure, those of ordinary skill in the art will be able to conceive different orientations for qubit(s), layer(s), light and laser source(s), coil(s), and chips, and the same are contemplated within the scope of the illustrative embodiments.

Figure 23:
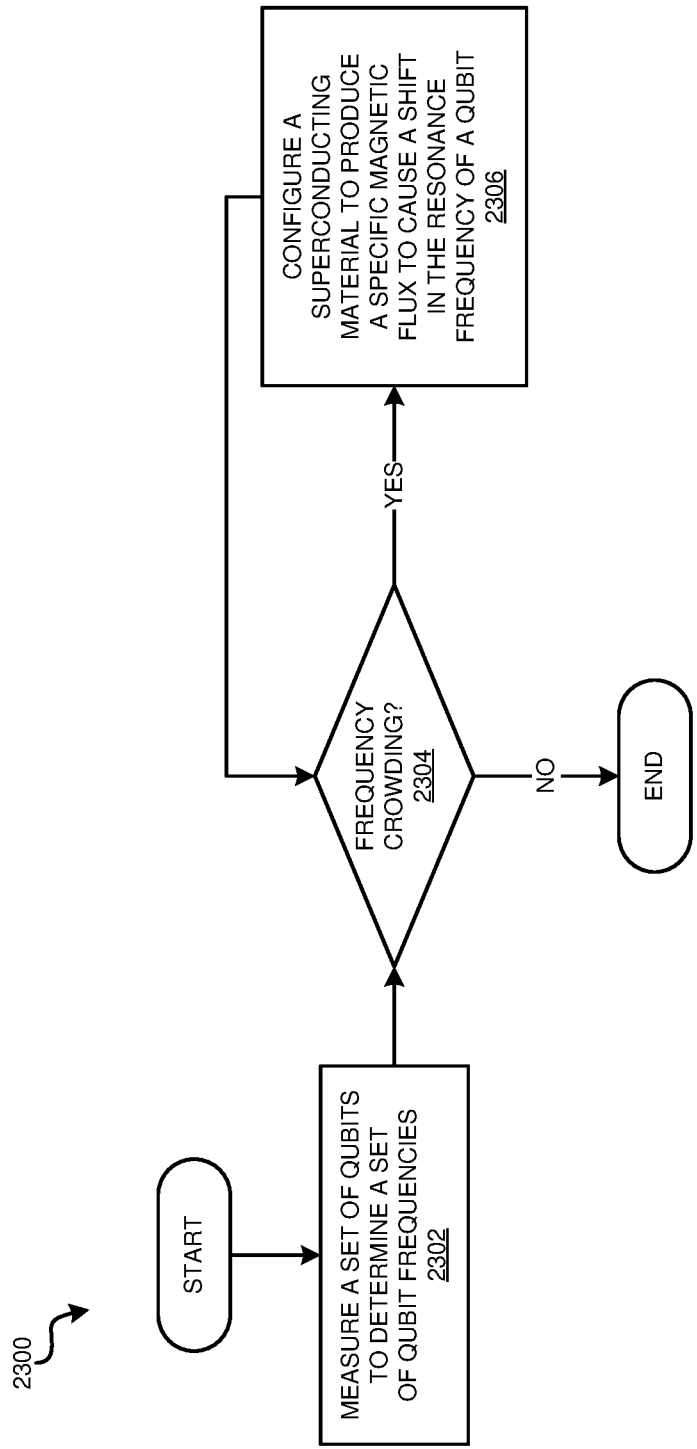
FIG. 23 depicts a flowchart of an example process for tuning a qubit in accordance with an illustrative embodiment.

With reference to FIG. 23, this figure depicts a flowchart of an example process for tuning a qubit in accordance with an illustrative embodiment. Process 2300 can be implemented in a fabrication system, e.g., in a software application that operates the fabrication system, to cause the described operations.

The embodiment measures a set of qubits to determine a set of qubit frequencies (block 2302). In response to the determined set of qubit frequencies, the embodiment analyses the set of frequencies to determine frequency crowding (block 2304). In an embodiment, frequency crowding occurs when neighboring qubits on a Q-processor chip have resonance frequencies within a threshold frequency range. For example, a threshold frequency range is 500 MHz. In an embodiment, the application identifies qubit candidates for tuning based on the frequency crowding analysis. If frequency crowding is present and qubit candidates are identified (YES path of block 2304), the application configures a superconducting material to produce a specific magnetic flux to cause a shift in the resonance frequency of a qubit (block 2306). Application returns to block 2304 to determine additional instances of frequency crowding. The embodiment repeats block 2306 as many times as may be needed to tune various qubits in a given implementation. If no frequency crowding is determined to occur (NO path of block 2304), the embodiment ends process 2300 thereafter.

Figure 24:
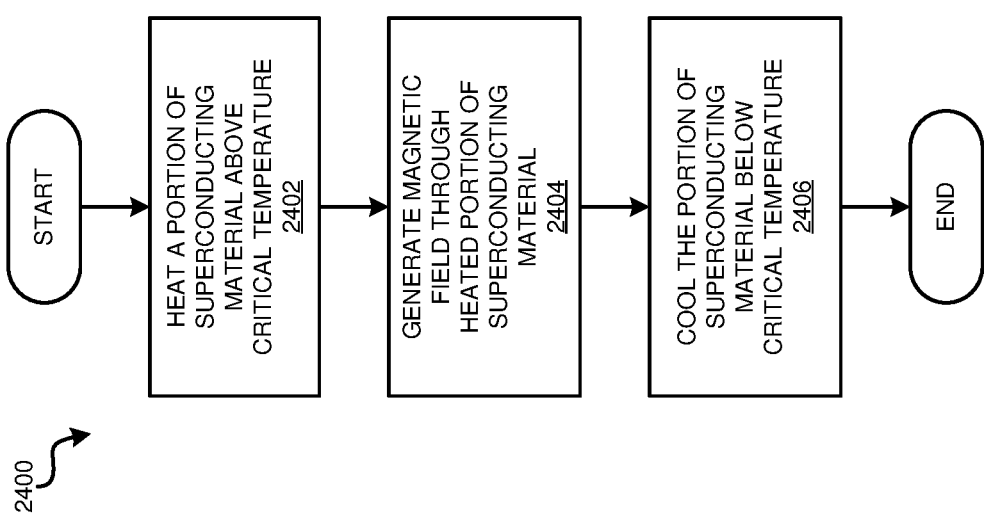
FIG. 24 depicts a flowchart of an example process for tuning a qubit in accordance with an illustrative embodiment.

With reference to FIG. 24, this figure depicts an example process of configuring an apparatus for tuning a qubit in accordance with an illustrative embodiment. Process 2400 can be implemented as block 2306 in FIG. 23.

When a need exists for a shift in a qubit's resonance frequency, the embodiment heats a portion of a superconducting material above a critical temperature (block 2402). For example, a resistor disposed on or adjacent to the superconducting material can heat a portion of the superconducting material above the critical temperature. As another example, a light source, such as a laser, can heat a portion of the superconducting material above the critical temperature. In an embodiment, a portion of a superconducting material is already above the critical temperature. In an embodiment, the entirety of the superconducting material is above a critical temperature. The application generates a magnetic field through the portion of the superconducting material above the critical temperature (block 2404). The application cools the portion of the superconducting material below the critical temperature while maintaining the applied magnetic field (block 2406). The embodiment ends process 2400 thereafter.

With reference to FIG. 25, this figure depicts an example process of configuring an apparatus for tuning a qubit in accordance with an illustrative embodiment. Process 2500 can be implemented as block 2306 in FIG. 23.

When a need exists for a shift in a qubit's resonance frequency, the embodiment generates a magnetic field through a first portion of a superconducting material above a critical temperature (block 2502). For example, a plurality of coils can be configured to generate the magnetic field, the magnetic field comprising a superposition of the magnetic field generated by each individual coil. The application configures the magnetic field through the portion (block 2504). In an embodiment, the application configures the magnetic field by controlling vector components (magnitude and direction) of the magnetic field in three spatial dimensions at the portion of the superconducting material. For example, the application can adjust a position of the first portion of the superconducting material, adjust a current (magnitude and direction) through any of the coils, or other operations to configure the magnetic field generated by the plurality of coils. The application cools the first portion of the superconducting material below the critical temperature while maintaining the applied magnetic field (block 2506). The embodiment ends process 2500 thereafter.

The circuit elements of the flux-biasing apparatus and connections thereto can be made of superconducting material. Examples of superconducting materials (at low temperatures, such as about 10-100 millikelvin (mK), or about 4 K) include Niobium, Aluminum, Tantalum, etc. For example, the Josephson junctions are made of superconducting material, and their tunnel junctions can be made of a thin tunnel barrier, such as an aluminum oxide. The capacitors can be made of superconducting material separated by low-loss dielectric material. The transmission lines (i.e., wires) connecting the various elements can be made of a superconducting material.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "illustrative" is used herein to mean "serving as an example, instance or illustration." Any embodiment or design described herein as "illustrative" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A device comprising:
   a first layer configured to generate a magnetic field, the first layer comprising a material exhibiting superconductivity in a cryogenic temperature range;
   a qubit of a quantum processor chip, wherein the first layer is configured to magnetically interact with the qubit such that a first magnetic flux of the first layer causes a first change in a first resonance frequency of the qubit by a first frequency shift value; and
   a heating element configured to heat a portion of the first layer above a critical temperature.

2. The device of claim 1, further comprising:
   a magnetic element configured to apply a magnetic field to the first layer.

3. The device of claim 2, wherein the heating element is a resistor.

4. The device of claim 2, wherein the heating element is a light source.

5. The device of claim 2, the magnetic element comprising:
   a wire of a superconducting material, the wire being formed into a coil structure.

6. The device of claim 2, wherein the heating element is one of a plurality of heating elements, each heating element configured to heat a corresponding portion of the first layer above a critical temperature.

7. The device of claim 6, wherein each portion of the first layer is configured to magnetically interact with a corresponding qubit of a plurality of qubits of the quantum processor such that a magnetic flux of each portion causes a change in a resonance frequency of the corresponding qubit.

8. The device of claim 1, wherein the first layer produces the first magnetic flux while operating in a range of temperatures between 20 Kelvin and 0.01 Kelvin, inclusive of both ends of the range.

9. The device of claim 1, further comprising:
   a second layer configured to generate a magnetic field, the second layer comprising a material exhibiting superconductivity in a cryogenic temperature range.

10. The device of claim 1, further comprising:
    a magnetic element disposed on a surface of a chip, wherein the first layer is formed on an opposite surface of the chip.

11. The device of claim 1, wherein the qubit is formed on a first surface of the quantum processor chip; and
    wherein the first layer is formed on an opposite surface of the quantum processor chip.

12. The device of claim 1, further comprising:
    a magnetic element configured to apply a magnetic field to the first layer, the magnetic element disposed on a first chip; and
    wherein the first layer is disposed on a second chip.

13. A method to fabricate a qubit tuning device, the method comprising:
    forming a first layer configured to generate a magnetic field, the first layer comprising a material exhibiting superconductivity in a cryogenic temperature range;
    forming a qubit on a quantum processor chip, wherein the first layer is configured to magnetically interact with the qubit such that a first magnetic flux of the first layer causes a first change in a first resonance frequency of the qubit by a first frequency shift value; and
    heating, using a heating element, a portion of the first layer above a critical temperature.

14. The method of claim 13, further comprising:
    forming a second layer configured to generate a magnetic field, the second layer comprising a material exhibiting superconductivity in a cryogenic temperature range.

15. The method of claim 13, wherein the first layer produces the first magnetic flux while operating in a range of temperatures between 20 Kelvin and 0.01 Kelvin, inclusive of both ends of the range.

16. The method of claim 13, further comprising:
    disposing a magnetic element on a surface of a chip, wherein the first layer is formed on an opposite surface of the chip.

17. The method of claim 13, wherein the qubit is formed on a first surface of the quantum processor chip; and wherein the first layer is formed on an opposite surface of the quantum processor chip.

18. A superconductor fabrication system which when operated to fabricate a qubit tuning device performs operations comprising:
   forming a first layer configured to generate a magnetic field, the first layer comprising a material exhibiting superconductivity in a cryogenic temperature range;
   forming a qubit on a quantum processor chip, wherein the first layer is configured to magnetically interact with the qubit such that a first magnetic flux of the first layer causes a first change in a first resonance frequency of the qubit by a first frequency shift value; and
   heating, using a heating element, a portion of the first layer above a critical temperature.

19. The superconductor fabrication system of claim 18, the operations further comprising:
   forming a second layer configured to generate a magnetic field, the second layer comprising a material exhibiting superconductivity in a cryogenic temperature range.

20. The superconductor fabrication system of claim 18, the operations further comprising:
   disposing a magnetic element on a surface of a chip, wherein the first layer is formed on an opposite surface of the chip.

* * * * *